(12) United States Patent
Wakabayashi et al.

(10) Patent No.: US 10,495,890 B2
(45) Date of Patent: Dec. 3, 2019

(54) LASER SYSTEM OR LASER EXPOSURE SYSTEM

(71) Applicant: Gigaphoton Inc., Tochigi (JP)

(72) Inventors: Osamu Wakabayashi, Oyama (JP); Kouji Kakizaki, Oyama (JP); Junichi Fujimoto, Oyama (JP)

(73) Assignee: Gigaphoton Inc., Tochigi (JP)

( * ) Notice: Subject to any disclaimer, the term of this patent is extended or adjusted under 35 U.S.C. 154(b) by 689 days.

(21) Appl. No.: 15/201,782

(22) Filed: Jul. 5, 2016

(65) Prior Publication Data

US 2016/0313564 A1 Oct. 27, 2016

Related U.S. Application Data

(63) Continuation of application No. PCT/JP2014/059502, filed on Mar. 31, 2014.

(51) Int. Cl.
*G02B 27/10* (2006.01)
*H01L 21/268* (2006.01)
(Continued)

(52) U.S. Cl.
CPC ...... *G02B 27/1086* (2013.01); *B23K 26/0608* (2013.01); *B23K 26/0643* (2013.01); *B23K 26/0652* (2013.01); *G02B 19/0047* (2013.01); *G02B 27/0905* (2013.01); *G02B 27/0944* (2013.01); *G02B 27/0961* (2013.01); *G02B 27/0977* (2013.01); *G02B 27/48* (2013.01); *H01L 21/02422* (2013.01); *H01L 21/02532* (2013.01); *H01L 21/02592* (2013.01); *H01L 21/02686* (2013.01); *H01L 21/268* (2013.01); *H01L 21/324* (2013.01); *H01L 27/1285* (2013.01); *H01S 3/23* (2013.01); *B23K 2103/172* (2018.08); *B23K 2103/56* (2018.08);
(Continued)

(58) Field of Classification Search
CPC ... G02B 27/1086; G02B 27/0905; H01S 3/23; H01S 3/005; B23K 26/064
USPC .................................................. 219/121.74
See application file for complete search history.

(56) References Cited

U.S. PATENT DOCUMENTS 7,061,959 B2  6/2006  Partlo et al.
8,416,500 B2  4/2013  Mitra et al.
(Continued)

FOREIGN PATENT DOCUMENTS

JP  H02-119128 A  5/1990
JP  2001-023919 A  1/2001
(Continued)

OTHER PUBLICATIONS

International Search Report issued in PCT/JP2014/059502; dated Jul. 8, 2014.
(Continued)

*Primary Examiner* — Dana Ross
*Assistant Examiner* — Joe E Mills, Jr.
(74) *Attorney, Agent, or Firm* — Studebaker & Brackett PC

(57) ABSTRACT

A laser exposure system may include a plurality of laser devices configured to output laser beams with which an irradiated subject is irradiated, and at least one beam property adjustment unit disposed on optical paths of the laser beams outputted from the plurality of laser devices, and configured to allow beam properties of the laser beams to be approximately a same as each other.

12 Claims, 15 Drawing Sheets

(51) Int. Cl.
  *H01L 21/02* (2006.01)
  *B23K 26/06* (2014.01)
  *B23K 103/00* (2006.01)
  *B23K 103/16* (2006.01)
  *G02B 19/00* (2006.01)
  *G02B 27/09* (2006.01)
  *H01L 21/324* (2006.01)
  *H01L 27/12* (2006.01)
  *H01S 3/23* (2006.01)
  *G02B 27/48* (2006.01)
  *H01S 3/00* (2006.01)
  *H01S 3/225* (2006.01)

(52) U.S. Cl.
  CPC ............... *H01S 3/005* (2013.01); *H01S 3/225* (2013.01); *H01S 3/2383* (2013.01)

(56) References Cited

U.S. PATENT DOCUMENTS

| | | | |
|---|---|---|---|
| 2003/0089691 A1 | 5/2003 | Tanaka | |
| 2005/0111339 A1 | 5/2005 | Tanaka | |
| 2007/0258077 A1* | 11/2007 | Tanaka | G02B 27/0905 355/71 |
| 2008/0031292 A1* | 2/2008 | Suzuki | G01J 9/0246 372/29.016 |
| 2009/0115990 A1* | 5/2009 | Owa | G02B 26/0833 355/71 |
| 2009/0285076 A1 | 11/2009 | Rothenberg | |
| 2014/0028985 A1* | 1/2014 | Janssens | G02B 27/48 353/31 |

FOREIGN PATENT DOCUMENTS

| | | |
|---|---|---|
| JP | 2002-176006 A | 6/2002 |
| JP | 2005-101202 A | 4/2005 |
| JP | 2005-294493 A | 10/2005 |
| JP | 2006-078655 A | 3/2006 |
| JP | 2007-103962 A | 4/2007 |
| JP | 2009-134316 A | 6/2009 |

OTHER PUBLICATIONS

Written Opinion issued in PCT/JP2014/059436; dated Jul. 8, 2014.

An Office Action mailed by the Japanese Patent Office dated Apr. 24, 2018, which corresponds to Japanese Patent Application No. 2016-511202 and is related to U.S. Appl. No. 15/201,782.

An Office Action mailed by the Japanese Patent Office dated Jan. 31, 2019, which corresponds to Japanese Patent Application No. 2016-511202 and is related to U.S. Appl. No. 15/201,782; with English translation.

* cited by examiner

LASER SYSTEM OR LASER EXPOSURE SYSTEM

CROSS-REFERENCE TO RELATED APPLICATIONS

This application claims the benefit of International Patent Application No. PCT/JP2014/059502 filed Mar. 31, 2014, which is incorporated herein by reference.

BACKGROUND

1. Technical Field

The present disclosure relates to a laser system or a laser exposure system.

2. Related Art

In a laser exposure system for laser annealing, an amorphous silicon film formed on a glass substrate is irradiated with a laser beam such as an excimer laser beam having a wavelength within the ultraviolet range, so that the amorphous silicon film is reformed into a polysilicon film. This reformation from an amorphous silicon film to a polysilicon film can produce a thin-film transistor (TFT). Such thin-film transistors have been used in relatively large liquid crystal displays.

CITATION LIST

Patent Literature

PTL1: U.S. Pat. No. 7,061,959
PTL2: U.S. Pat. No. 8,416,500
PTL3: U.S. Patent Application Publication No. 2009/0285076

SUMMARY

According to an aspect of the present disclosure, a laser exposure system may include: a plurality of laser devices configured to output laser beams with which an irradiated subject is irradiated; and at least one beam property adjustment unit disposed on optical paths of the laser beams outputted from the plurality of laser devices, and configured to allow beam properties of the laser beams to be approximately a same as each other.

BRIEF DESCRIPTION OF THE DRAWINGS

Hereinafter, selected embodiments of the present disclosure will be described with reference to the accompanying drawings by way of example.

DESCRIPTION OF EXEMPLARY EMBODIMENTS

Figure 1:
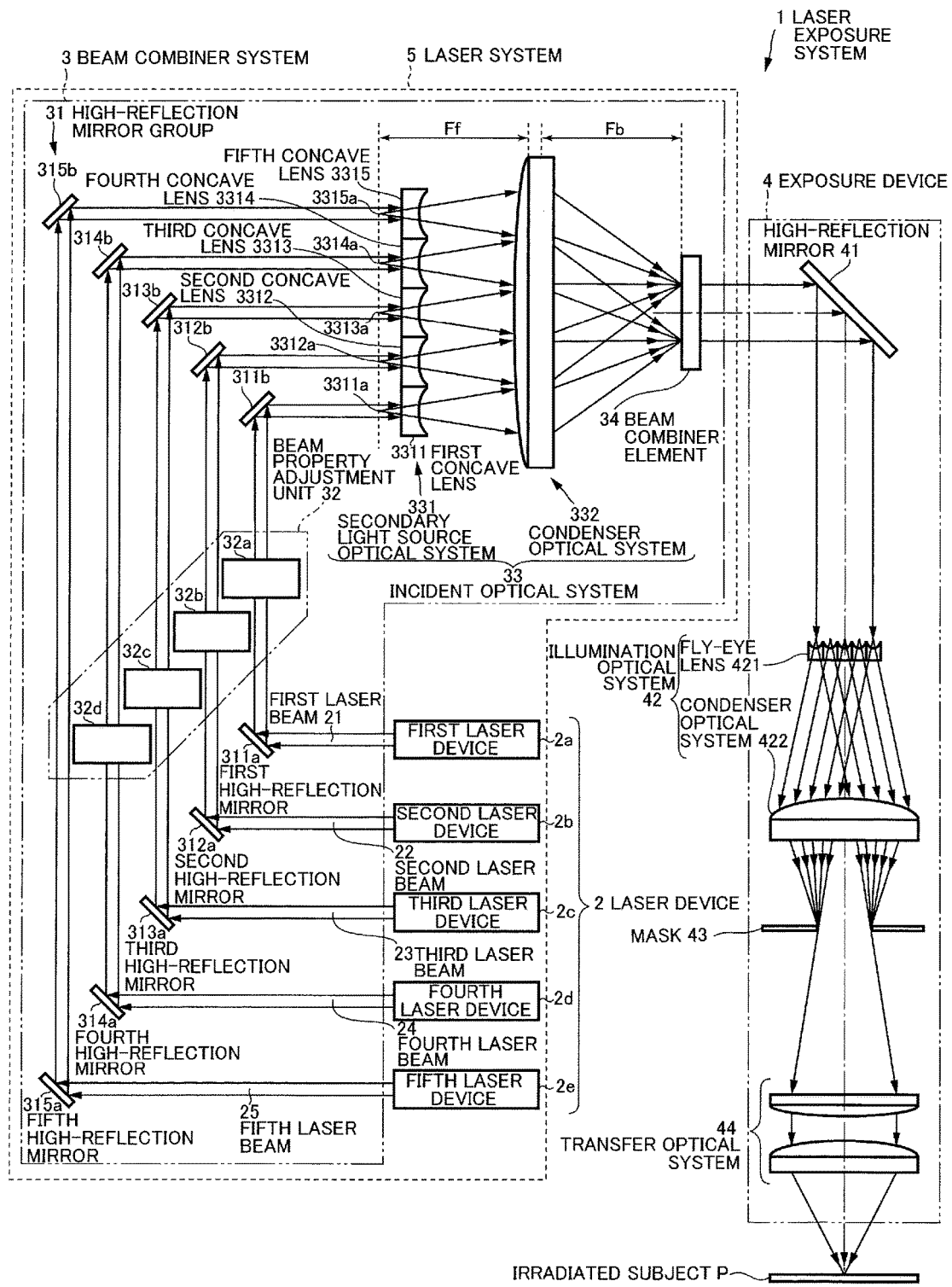
FIG. 1 is a drawing explaining a laser exposure system including a plurality of laser devices.

<Contents>
1. Overview
2. Description of terms
3. Laser exposure system including a plurality of laser devices
 3.1 Configuration
 3.2 Operation
 3.3 Effect
4. Beam combiner element
 4.1 Beam combiner element including a diffractive optical element
 4.2 Beam combiner element including an integrator optical system
5. Incident optical system
 5.1 Incident optical system including a mirror optical system
 5.2 Incident optical system including a prism optical system
 5.3 Incident optical system for converting beams into parallel beams
6. Beam property adjustment unit
 6.1 Beam property adjustment unit including an optical path length adjustment unit
 6.2 Beam property adjustment unit including a beam transfer unit
 6.3 Combination of the configurations of the beam property adjustment unit
7. Optical system in the exposure device
 7.1 Illumination optical system
 7.2 Line-focus optical system
8. Others
 8.1 Fly-eye lens
 8.2 Holder including a refrigerant flow path
 8.3 Modification Hereinafter, selected embodiments of the present disclosure will be described in detail with reference to the accompanying drawings. The embodiments to be described below are merely examples and do not limit the scope of the present disclosure. Further, the configuration(s) and operation(s) described in each embodiment are not all essential in implementing the present disclosure. Note that like elements are referenced by like reference numerals and characters, and duplicate descriptions thereof will be omitted herein.

1. Overview

The present disclosure may disclose at least the following embodiments.

A laser exposure system 1 may include: a plurality of laser devices 2 configured to output laser beams with which an irradiated subject P is irradiated; and at least one beam property adjustment unit 32 disposed on optical paths of the laser beams outputted from the plurality of laser devices 2, and configured to allow beam properties of the laser beams to be approximately a same as each other. With this configuration, the laser exposure system 1 can output a laser beam having stable beam properties with a high pulse energy, and achieve a high throughput.

2. Description of Terms

"Optical path axis" refers to an axis passing through the center of the beam cross-section of a laser beam along the traveling direction of the laser beam. "Optical path" refers to a path through which the laser beam passes. The optical path may include the optical path axis. "Upstream side" of the optical path of a laser beam is the side near the laser device. Meanwhile, "downstream side" of the optical path of the laser beam is the side far from the laser device. "Beam multiplexing" means that a plurality of laser beams having different optical paths are superposed to have approximately the same optical path.

3. Laser Exposure System Including a Plurality of Laser Devices

Now, with reference to FIG. 1, the laser exposure system 1 including the plurality of laser devices 2 will be described. FIG. 1 is a drawing explaining the laser exposure system 1 including the plurality of laser devices 2.

3.1 Configuration

The laser exposure system 1 may be configured to irradiate an irradiated subject P with a laser beam to laser anneal the irradiated subject P. The irradiated subject P may be a glass substrate on which, for example, an amorphous silicon film is formed. When the amorphous silicon film is laser annealed with a laser beam having a wavelength within the ultraviolet range, the amorphous silicon film can be reformed into a polysilicon film. The laser exposure system 1 may include a laser system 5 and an exposure device 4. The laser system 5 may include the plurality of laser devices 2 and a beam combiner system 3.

Each of the plurality of laser devices 2 may be configured to output a pulsed laser beam having a wavelength within the ultraviolet range. Each of the plurality of laser devices 2 may be an excimer laser device using, for example, XeF, XeCl, KrF, or ArF, as laser medium. The plurality of laser devices 2 may be substantially identical laser devices. The number of the plurality of laser devices 2 may not be limited, but may be two or more. Hereinafter, the number of the plurality of laser devices 2 will be five for the sake of convenience. The plurality of laser devices 2 are constituted by first to fifth laser devices 2a to 2e.

The beam combiner system 3 may be configured to multiplex a plurality of laser beams outputted from the plurality of laser devices 2 and emit a multiplexed laser beam to the exposure device 4. The beam combiner system 3 may include a high-reflection mirror group 31, a beam property adjustment unit 32, an incident optical system 33, and a beam combiner element 34.

The high-reflection mirror group 31 may reflect the plurality of laser beams outputted from the plurality of laser devices 2 and allow the reflected laser beams to enter the incident optical system 33. The number of the high-reflection mirrors of the high-reflection mirror group 31 may correspond to the number of the plurality of laser devices 2. The high-reflection mirror group 31 may include first high-reflection mirrors 311a and 311b, second high-reflection mirrors 312a and 312b, third high-reflection mirrors 313a and 313b, fourth high-reflection mirrors 314a and 314b, and fifth high-reflection mirrors 315a and 315b.

The first high-reflection mirrors 311a and 311b may be disposed such that a first laser beam 21 outputted from a first laser device 2a enters a first concave lens 3311 (described later) of the incident optical system 33. The first high-reflection mirror 311a may be disposed to face the first laser device 2a and the first high-reflection mirror 311b. The first high-reflection mirror 311b may be disposed to face the first high-reflection mirror 311a and the first concave lens 3311.

The second high-reflection mirrors 312a and 312b may be disposed such that a second laser beam 22 outputted from a second laser device 2b enters a second concave lens 3312 (described later) of the incident optical system 33. The second high-reflection mirror 312a may be disposed to face the second laser device 2b and the second high-reflection mirror 312b. The second high-reflection mirror 312b may be disposed to face the second high-reflection mirror 312a and the second concave lens 3312.

The third high-reflection mirrors 313a and 313b may be disposed such that a third laser beam 23 outputted from a third laser device 2c enters a third concave lens 3313 (described later) of the incident optical system 33. The third high-reflection mirror 313a may be disposed to face the third laser device 2c and the third high-reflection mirror 313b. The third high-reflection mirror 313b may be disposed to face the third high-reflection mirror 313a and the third concave lens 3313.

The fourth high-reflection mirrors 314a and 314b may be disposed such that a fourth laser beam 24 outputted from a fourth laser device 2d enters a fourth concave lens 3314 (described later) of the incident optical system 33. The fourth high-reflection mirror 314a may be disposed to face the fourth laser device 2d and the fourth high-reflection mirror 314b. The fourth high-reflection mirror 314b may be disposed to face the fourth high-reflection mirror 314a and the fourth concave lens 3314.

The fifth high-reflection mirrors 315a and 315b may be disposed such that a fifth laser beam 25 outputted from a fifth laser device 2e may enter a fifth concave lens 3315 (described later) of the incident optical system 33. The fifth high-reflection mirror 315a may be disposed to face the fifth laser device 2e and the fifth high-reflection mirror 315b. The fifth high-reflection mirror 315b may be disposed to face the fifth high-reflection mirror 315a and the fifth concave lens 3315.

The beam property adjustment unit 32 may substantially equalize the beam properties of the plurality of laser beams outputted from the plurality of laser devices 2. However, for example, in factories, the layout of the plurality of laser devices 2 may not allow the beam properties of the plurality of laser beams outputted from the plurality of laser devices 2 to be approximately the same as each other in many cases. In such cases, the laser exposure system 1 may use the beam property adjustment unit 32 to substantially equalize the beam properties of the plurality of laser beams. The beam properties may include the optical path length of the laser beams, the beam divergence, the beam profile, the beam size, the beam cross-sectional area, and so forth. The beam property adjustment unit 32 may be disposed on the optical paths of the plurality of laser beams outputted from the plurality of laser devices 2.

The beam property adjustment unit 32 shown in FIG. 1 may substantially equalize the beam properties of the first to fourth laser beams 21 to 24 outputted from the first to fourth laser devices 2a to 2d with the beam property of the fifth laser beam 25 outputted from the fifth laser device 2e. In this case, the beam property adjustment unit 32 may include the first to fourth beam property adjustment units 32a to 32d. The first to fourth beam property adjustment units 32a to 32d may have substantially the same configuration. Hereinafter, the beam property adjustment unit 32 shown in FIG. 1 will be described as a beam property adjustment unit configured to adjust the optical path length of the laser beam, among various beam properties.

The first beam property adjustment unit 32a may substantially equalize the beam property of the first laser beam 21 outputted from the first laser device 2a with the beam property of the fifth laser beam 25 outputted from the fifth laser device 2e. The first beam property adjustment unit 32a may be disposed between the first high-reflection mirror 311a and the first high-reflection mirror 311b, on the optical path of the first laser beam 21 outputted from the first laser device 2a.

The second beam property adjustment unit 32b may substantially equalize the beam property of the second laser beam 22 outputted from the second laser device 2b with the beam property of the fifth laser beam 25 outputted from the fifth laser device 2e. The second beam property adjustment unit 32b may be disposed between the second high-reflection mirror 312a and the second high-reflection mirror 312b, on the optical path of the second laser beam 22 outputted from the second laser device 2b.

The third beam property adjustment unit 32c may substantially equalize the beam property of the third laser beam 23 outputted from the third laser device 2c with the beam property of the fifth laser beam 25 outputted from the fifth laser device 2e. The third beam property adjustment unit 32c may be disposed between the third high-reflection mirror 313a and the third high-reflection mirror 313b, on the optical path of the third laser beam 23 outputted from the third laser device 2c.

The fourth beam property adjustment unit 32d may substantially equalize the beam property of the fourth laser beam 24 outputted from the fourth laser device 2d with the beam property of the fifth laser beam 25 outputted from the fifth laser device 2e. The fourth beam property adjustment unit 32d may be disposed between the fourth high-reflection mirror 314a and the fourth high-reflection mirror 314b, on the optical path of the fourth laser beam 24 outputted from the fourth laser device 2d.

Here, when the beam property adjustment unit 32 substantially equalizes the beam properties of the first to fifth laser beams 21 to 25 outputted from the first to fifth laser devices 2a to 2e with a predetermined beam property, an additional beam property adjustment unit may be disposed on the optical path of the fifth laser beam 25. The detailed configuration of the beam property adjustment unit 32 will be described laser with reference to FIGS. 7 to 9.

The incident optical system 33 may be an optical system configured to allow the plurality of laser beams outputted from the plurality of laser devices 2 to enter the beam combiner element 34. The incident optical system 33 may be disposed between the plurality of laser devices 2 and the beam combiner element 34, on the optical paths of the plurality of laser beams outputted from the plurality of laser devices 2. The incident optical system 33 may include a secondary light source optical system 331 and a condenser optical system 332. The secondary light source optical system 331 and the condenser optical system 332 may be designed to provide Kohler illumination.

The plurality of laser beams outputted from the plurality of laser devices 2 as primary light sources enter the secondary light source optical system 331, so that the secondary light source optical system 331 may serve as a secondary light source for the plurality of laser devices 2. The secondary light source optical system 331 may include first to fifth concave lenses 3311 to 3315.

The first concave lens 3311 may be disposed between the first high-reflection mirrors 311a and 311b and the condenser optical system 332, on the optical path of the first laser beam 21 outputted from the first laser device 2a. The first concave lens 3311 may be disposed such that the position of a focal point 3311a of the first concave lens 3311 substantially coincides with the position of the front focal plane of the condenser optical system 332. The first concave lens 3311 may diffuse the first laser beam 21, which has been outputted from the first laser device 2a and entered the first concave lens 3311 via the first high-reflection mirrors 311a and 311b, and emit the first diffused laser beam 21 to the condenser optical system 332. The condenser optical system 332 may allow the incident surface of the beam combiner element 34 to be irradiated with the first laser beam 21 emitted from the first concave lens 3311. The first concave lens 3311 may be disposed such that the first laser beam 21 emitted from the first concave lens 3311 enters the beam combiner element 34 at a predetermined angle. This predetermined angle may allow the first laser beam 21 to be multiplexed with the other laser beams by the beam combiner element 34.

The second concave lens 3312 may be disposed between the second high-reflection mirrors 312a and 312b and the condenser optical system 332, on the optical path of the second laser beam 22 outputted from the second laser device 2b. The second concave lens 3312 may be disposed such that the position of a focal point 3312a of the second concave lens 3312 substantially coincides with the position of the front focal plane of the condenser optical system 332. The second concave lens 3312 may diffuse the second laser beam 22, which has been outputted from the second laser device 2b and entered the second concave lens 3312 via the second high-reflection mirrors 312a and 312b, and emit the second diffused laser beam 22 to the condenser optical system 332. The condenser optical system 332 may allow the incident surface of the beam combiner element 34 to be irradiated with the second laser beam 22 emitted from the second concave lens 3312. The second concave lens 3312 may be disposed such that the second laser beam 22 emitted from the second concave lens 3312 enters the beam combiner element 34 at a predetermined angle. This predetermined angle may allow the second laser beam 22 to be multiplexed with the other laser beams by the beam combiner element 34.

The third concave lens 3313 may be disposed between the third high-reflection mirrors 313a and 313b and the condenser optical system 332, on the optical path of the third laser beam 23 outputted from the third laser device 2c. The third concave lens 3313 may be disposed such that the position of a focal point 3313a of the third concave lens 3313 substantially coincides with the position of the front focal plane of the condenser optical system 332. The third concave lens 3313 may diffuse the third laser beam 23, which has been outputted from the third laser device 2c and entered the third concave lens 3313 via the third high-reflection mirrors 313a and 313b, and emit the third diffused laser beam 23 to the condenser optical system 332. The condenser optical system 332 may allow the incident surface of the beam combiner element 34 to be irradiated with the third laser beam 23 emitted from the third concave lens 3313. The third concave lens 3313 may be disposed such that the third laser beam 23 emitted from the third concave lens 3313 enters the beam combiner element 34 at a predetermined angle. This predetermined angle may allow the third laser beam 23 to be multiplexed with the other laser beams by the beam combiner element 34.

The fourth concave lens 3314 may be disposed between the fourth high-reflection mirrors 314a and 314b and the condenser optical system 332, on the optical path of the fourth laser beam 24 outputted from the fourth laser device 2d. The fourth concave lens 3314 may be disposed such that the position of a focal point 3314a of the fourth concave lens 3314 substantially coincides with the position of the front focal plane of the condenser optical system 332. The fourth concave lens 3314 may diffuse the fourth laser beam 24, which has been outputted from the fourth laser device 2d and entered the fourth concave lens 3314 via the fourth high-reflection mirrors 314a and 314b, and emit the fourth diffused laser beam 24 to the condenser optical system 332. The condenser optical system 332 may allow the incident surface of the beam combiner element 34 to be irradiated with the fourth laser beam 24 emitted from the fourth concave lens 3314. The fourth concave lens 3314 may be disposed such that the fourth laser beam 24 emitted from the fourth concave lens 3314 enters the beam combiner element 34 at a predetermined angle. This predetermined angle may allow the fourth laser beam 24 to be multiplexed with the other laser beams by the beam combiner element 34.

The fifth concave lens 3315 may be disposed between the fifth high-reflection mirrors 315a and 315b and the condenser optical system 332, on the optical path of the fifth laser beam 25 outputted from the fifth laser device 2e. The fifth concave lens 3315 may be disposed such that the position of a focal point 3315a of the fifth concave lens 3315 substantially coincides with the position of the front focal plane of the condenser optical system 332. The fifth concave lens 3315 may diffuse the fifth laser beam 25, which has been outputted from the fifth laser device 2e and entered the fifth concave lens 3315 via the fifth high-reflection mirrors 315a and 315b, and emit the fifth diffused laser beam 25 to the condenser optical system 332. The condenser optical system 332 may allow the incident surface of the beam combiner element 34 to be irradiated with the fifth laser beam 25 emitted from the fifth concave lens 3315. The fifth concave lens 3315 may be disposed such that the fifth laser beam 25 emitted from the fifth concave lens 3315 enters the beam combiner element 34 at a predetermined angle. This predetermined angle may allow the fifth laser beam 25 to be multiplexed with the other laser beams by the beam combiner element 34.

The condenser optical system 332 may be an optical system configured to allow the incident surface of the beam combiner element 34 to be irradiated with the plurality of laser beams emitted from the secondary light source optical system 331. The condenser optical system 332 may be disposed between the secondary light source optical system 331 and the beam combiner element 34, on the optical paths of the plurality of laser beams outputted from the plurality of laser devices 2. The condenser optical system 332 may be disposed such that the position of the back focal plane of the condenser optical system 332 substantially coincides with the position of the incident surface of the beam combiner element 34. The condenser optical system 332 may be disposed such that the position of the front focal plane of the condenser optical system 332 substantially coincides with the position of the focal points 3311a to 3315a of the first to fifth concave lenses 3311 to 3315. The condenser optical system 332 may be constituted by combining a convex lens and a concave lens (not shown).

Here, the number of the laser devices 2 is represented by n, and each of the beam cross-sectional areas of the plurality of laser beams at the exits of the plurality of laser devices 2 is represented by $S_0$. A beam cross-sectional area of the laser beams that have been emitted from the incident optical system 33 and enter the beam combiner element 34 is represented by $S_c$. The effective area of the incident surface of the beam combiner element 34 is represented by $S_{max}$. Here, the incident optical system 33 including the secondary light source optical system 331 and the condenser optical system 332 may be designed to satisfy at least the following relational expression.

$$S_c \geq n \cdot S_0$$

The incident optical system 33 may allow a laser beam having a beam cross-sectional area larger than each of the beam cross-sectional areas of the plurality of laser beams at the exits of the plurality of laser devices 2 to enter the beam combiner element 34. More preferably, the incident optical system 33 may be designed to satisfy the following relational expression.

$$n \cdot S_0 \leq S_c \leq S_{max}$$

The incident optical system 33 may allow laser beams to enter the beam combiner element 34 to effectively multiplex the laser beams by the beam combiner element 34. Here, different configurations of the incident optical system 33 will be described later with reference to FIGS. 4 to 6.

The beam combiner element 34 may be an optical system configured to multiplex the plurality of laser beams outputted from the plurality of laser devices 2. To be more specific, the beam combiner element 34 may be an optical system configured to superpose the plurality of laser beams outputted from the plurality of laser devices 2 such that the optical paths of the plurality of laser beams substantially coincide with each other. The beam combiner element 34 may superpose the plurality of laser beams such that the optical paths of the plurality of laser beams substantially coincide with each other on the incident surface of a fly-eye lens 421 (described later) of the exposure device 4. In other words, the beam combiner element 34 may allow the plurality of laser beams to be multiplexed on at least the incident surface of the fly-eye lens 421 of the exposure device 4. The beam combiner element 34 may be disposed such that the position of the incident surface of the beam combiner element 34 substantially coincides with the position of the back focal plane of the condenser optical system 332. The detailed configuration of the beam combiner element 34 will be described later with reference to FIGS. 2 and 3.

The exposure device 4 may form a laser beam emitted from the beam combiner system 3 into a predetermined mask pattern, and irradiate the irradiated subject P with the laser beam in the predetermined mask pattern. The exposure device 4 may include a high-reflection mirror 41, an illumination optical system 42, a mask 43, and a transfer optical system 44.

The high-reflection mirror 41 may reflect the laser beam emitted from the beam combiner system 3 so that the laser beam enters the illumination optical system 42. The high-reflection mirror 41 may be disposed on the optical path of the laser beam emitted from the beam combiner system 3. The high-reflection mirror 41 may be disposed to face the beam combiner element 34 of the beam combiner system 3 and the fly-eye lens 421 (described later) of the illumination optical system 42.

The illumination optical system 42 may illuminate the mask 43 with the laser beam emitted from the beam combiner system 3. The illumination optical system 42 may be disposed between the high-reflection mirror 41 and the mask 43, on the optical paths of the laser beams emitted from the beam combiner system 3. The illumination optical system 42 may include the fly-eye lens 421 and a condenser optical system 422. The fly-eye lens 421 and the condenser optical system 422 may be designed to provide Kohler illumination.

The fly-eye lens 421 may divide and diffuse the laser beam emitted from the beam combiner system 3, and emit the diffused laser beams to the condenser optical system 422. The fly-eye lens 421 may be disposed between the high-reflection mirror 41 and the condenser optical system 422, on the optical paths of the laser beams emitted from the beam combiner system 3. Here, the detailed configuration of a plurality of lenses included in the fly-eye lens 421 will be described laser with reference to FIGS. 14A and 14B.

The condenser optical system 422 may be an optical system configured to illuminate the mask 43 with the laser beams emitted from the fly-eye lens 421. The condenser optical system 422 may be disposed between the fly-eye lens 421 and the mask 43, on the optical paths of the laser beams emitted from the beam combiner system 3. The condenser optical system 422 may be disposed such that the position of the back focal plane of the condenser optical system 422 substantially coincides with the position of the mask 43. The condenser optical system 422 may be constituted by combining a convex lens and a concave lens (not shown).

The mask 43 may form the laser beam emitted from the beam combiner system 3 into a predetermined mask pattern. The mask 43 may be a slit having a rectangular opening. Alternatively, the mask 43 may be a slit having a linear opening. The shape of the opening of the slit may form the mask pattern of the mask 43. The mask pattern of the mask 43 may not be limited to the rectangular or linear shape, but have a desired shape. The mask 43 may be disposed such that the position of the opening of the mask 43 substantially coincides with the position of the back focal plane of the condenser optical system 422.

The transfer optical system 44 may transfer the image of the laser beam formed in the mask pattern of the mask 43 to focus the image on the irradiated position of the irradiated subject P. The transfer optical system 44 may be disposed between the mask 43 and the irradiated subject P, on the optical paths of the laser beams emitted from the beam combiner system 3. The transfer optical system 44 may be disposed such that the position of an object on the transfer optical system 44 substantially coincides with the position of the opening of the mask 43. The transfer optical system 44 may be disposed such that the position of the image of the mask 43 in the transfer optical system 44 substantially coincides with the irradiated position of the irradiated subject P. The transfer optical system 44 may be formed by combining two convex lenses. However, this is by no means limiting. The transfer optical system 44 may be formed by combining, for example, a convex lens and a concave lens. The transfer optical system 44 may be formed with a cylindrical lens configured to function only in the short sides of the rectangular mask pattern to transfer the rectangular mask pattern to the irradiated subject P. Here, different configurations of the optical systems in the exposure device 4 will be described later with reference to FIGS. 10 to 13.

3.2 Operation

The first to fifth laser devices 2a to 2e may receive oscillation trigger signals for the first to fifth laser beams 21 to 25 from a laser controller (not shown) at approximately the same timing. The approximately the same timing may be a timing within a range, for example, from about several ns to 10 ns. Upon receiving the oscillation trigger signals, the first to fifth laser devices 2a to 2e may output the first to fifth laser beams 21 to 25, respectively.

The fifth laser beam 25 outputted from the fifth laser device 2e may be reflected from the fifth high-reflection mirrors 315a and 315b, and enter the fifth concave lens 3315. The fifth laser beam 25 having entered the fifth concave lens 3315 may be expanded by the fifth concave lens 3315, and enter the condenser optical system 332. The fifth laser beam 25 having entered the condenser optical system 332 may be collimated by the condenser optical system 332, and emitted to the incident surface of the beam combiner element 34. At this time, the fifth laser beam 25 may enter the incident surface of the beam combiner element 34 at a predetermined angle. Here, the optical path length of the fifth laser beam 25 between the fifth laser device 2e and the beam combiner element 34 is represented by $L_0$.

The first laser beam 21 outputted from the first laser device 2a may be reflected from the first high-reflection mirror 311a, and enter the first beam property adjustment unit 32a. Upon entering the first beam property adjustment unit 32a, the optical path length of the first laser beam 21 between the first laser device 2a and the beam combiner element 34 may be adjusted to be approximately the same as $L_0$. The first laser beam 21 whose optical path length has been adjusted by the first beam property adjustment unit 32a may be reflected from the first high-reflection mirror 311b, and enter the first concave lens 3311. The first laser beam 21 having entered the first concave lens 3311 may be expanded by the first concave lens 3311, and enter the condenser optical system 332. The first laser beam 21 having entered the condenser optical system 332 may be collimated by the condenser optical system 332, and emitted to the incident surface of the beam combiner element 34. At this time, the first laser beam 21 may enter the incident surface of the beam combiner element 34 at a predetermined angle. The first laser beam 21 having entered the beam combiner element 34 may be superposed with the fifth laser beam 25 on the incident surface of the beam combiner element 34.

The second laser beam 22 outputted from the second laser device 2b may be reflected from the second high-reflection mirror 312a, and enter the second beam property adjustment unit 32b. Upon entering the second beam property adjustment unit 32b, the optical path length of the second laser beam 22 between the second laser device 2b and the beam combiner element 34 may be adjusted to be approximately the same as $L_0$. The second laser beam 22 whose optical path length has been adjusted by the second beam property adjustment unit 32b may be reflected from the second high-reflection mirror 312b, and enter the second concave lens 3312. The second laser beam 22 having entered the second concave lens 3312 may be expanded by the second concave lens 3312, and enter the condenser optical system 332. The second laser beam 22 having entered the condenser optical system 332 may be collimated by the condenser optical system 332, and emitted to the incident surface of the beam combiner element 34. At this time, the second laser beam 22 may enter the incident surface of the beam combiner element 34 at a predetermined angle. The second laser beam 22 having entered the beam combiner element 34 may be superposed with the first laser beam 21 and the fifth laser beam 25 on the incident surface of the beam combiner element 34.

The third laser beam 23 outputted from the third laser device 2c may be reflected from the third high-reflection mirror 313a, and enter the third beam property adjustment unit 32c. Upon entering the third beam property adjustment unit 32c, the optical path length of the third laser beam 23 between the third laser device 2c and the beam combiner element 34 may be adjusted to be approximately the same as $L_0$. The third laser beam 23 whose optical path length has been adjusted by the third beam property adjustment unit 32c may be reflected from the third high-reflection mirror 313b, and enter the third concave lens 3313. The third laser beam 23 having entered the third concave lens 3313 may be expanded by the third concave lens 3313, and enter the condenser optical system 332. The third laser beam 23 having entered the condenser optical system 332 may be collimated by the condenser optical system 332, and emitted to the incident surface of the beam combiner element 34. At this time, the third laser beam 23 may enter the incident surface of the beam combiner element 34 at a predetermined angle. The third laser beam 23 having entered the beam combiner element 34 may be superposed with the first laser beam 21, the second laser beam 22 and the fifth laser beam 25 on the incident surface of the beam combiner element 34.

The fourth laser beam 24 outputted from the fourth laser device 2d may be reflected from the fourth high-reflection mirror 314a, and enter the fourth beam property adjustment unit 32d. Upon entering the fourth beam property adjustment unit 32d, the optical path length of the fourth laser beam 24 between the fourth laser device 2d and the beam combiner element 34 may be adjusted to be approximately the same as $L_0$. The fourth laser beam 24 whose optical path length has been adjusted by the fourth beam property adjustment unit 32d may be reflected from the fourth high-reflection mirror 314b, and enter the fourth concave lens 3314. The fourth laser beam 24 having entered the fourth concave lens 3314 may be expanded by the fourth concave lens 3314, and enter the condenser optical system 332. The fourth laser beam 24 having entered the condenser optical system 332 may be collimated by the condenser optical system 332, and emitted to the incident surface of the beam combiner element 34. At this time, the fourth laser beam 24 may enter the incident surface of the beam combiner element 34 at a predetermined angle. The fourth laser beam 24 having entered the beam combiner element 34 may be superposed with the first to third and fifth laser beams 21 to 23, and 25 on the incident surface of the beam combiner element 34.

The first to fifth laser beams 21 to 25 superposed on the incident surface of the beam combiner element 34 may transmit through the beam combiner element 34, and be multiplexed. The laser beam emitted from the beam combiner element 34 may enter the exposure device 4.

The laser beam having entered the exposure device 4 may be reflected from the high-reflection mirror 41, and enter the fly-eye lens 421 of the illumination optical system 42. The laser beam having entered the fly-eye lens 421 may transmit through the fly-eye lens 421 and therefore be divided and diffused, and then enter the condenser optical system 422. The laser beams having entered the condenser optical system 422 may transmit through the condenser optical system 422, and be emitted to the opening of the mask 43 located in the back focal plane of the condenser optical system 422. The laser beams emitted from the condenser optical system 422 may become a laser beam whose light intensity distribution in the beam cross-section is equalized at the opening of the mask 43.

The laser beam uniformly emitted to the mask 43 may be formed into the mask pattern of the mask 43, and enter the transfer optical system 44. The image of the mask pattern may be transferred to the irradiated position of irradiated subject P to focus the image by the transfer optical system 44. The irradiated subject P may be irradiated with a laser beam obtained by multiplexing the first to fifth laser beams 21 to 25. The laser beam obtained by multiplexing the first to fifth laser beams 21 to 25 may have a pulse energy which is five times as much as a laser beam outputted from one laser device.

3.3 Effect

The laser system 5 can multiplex the plurality of laser beams outputted from the plurality of laser devices 2. Then, the laser system 5 can allow the multiplexed laser beams to enter the exposure device 4. In the exposure device 4, the irradiated subject P can be irradiated with the multiplexed laser beams. Therefore, the laser system 5 can increase the pulse energy of the laser beams entering the exposure device 4. Moreover, the laser system 5 can increase the area of the laser beam with which the irradiated subject P is irradiated per pulse. As a result, the laser exposure system 1 can efficiently supply a pulse energy to the irradiated subject P having a large area, and therefore it makes it possible to produce a large-sized liquid crystal display. Moreover, the laser exposure system 1 can improve the throughput of a manufacturing process for laser irradiation such as laser annealing. In addition, the laser system 5 can multiplex the plurality of laser beams and irradiate the irradiated subject P with the multiplexed laser beams. Therefore, it is possible to uniform the light intensity distribution in the beam cross-section of the laser beam with which the irradiated subject P is irradiated. As a result, the laser exposure system 1 can uniformly irradiate the irradiated subject P with the laser beam.

The laser system 5 can substantially equalize the beam properties of the plurality of laser beams outputted from the plurality of laser devices 2, and therefore multiplex the plurality of laser beams. Therefore, the laser system 5 may prevent the beam properties of the laser beams from being changed before and after the multiplexing. As a result, the laser exposure system 1 can employ the configuration of the exposure device 4 which is the same as the configuration of an exposure device of a laser exposure system including one laser device, and therefore be easily realized at low cost.

The laser system 5 can expand the beam cross-sectional areas of the plurality of laser beams outputted from the plurality of laser devices 2 and allow the expanded laser beams to enter the beam combiner element 34. Therefore, it is possible to reduce the density of the energy of the laser beams on the incident surface of the beam combiner element 34. As a result, it is possible to prevent the beam combiner element 34 of the laser exposure system 1 from being damaged due to the entering laser beams, and therefore to lengthen the life of the beam combiner element 34.

A laser system constituting the laser exposure system for laser annealing is required to output a laser beam having a stable beam property to the exposure device at a high pulse energy. However, there may be a limitation to increase the power of one laser device in order to increase the pulse energy of the laser beam outputted to the exposure device. In addition, conventional laser systems might have had problems with the superposition of the plurality of laser beams outputted from the plurality of laser devices in order to increase the pulse energy, in terms of the stability of the beam property and the throughput. With the above-described configuration, the laser system 5 according to the present embodiment can output a laser beam having a stable beam property to the exposure device 4 at a high pulse energy. As a result, the laser exposure system 1 can achieve large-area exposure and a high throughput.

4. Beam Combiner Element

Now, with reference to FIGS. 2 and 3, the detailed configuration of the beam combiner element 34 will be described. The beam combiner element 34 may be constituted by using a diffractive optical element (DOE) 341 or an integrator optical system 342. The configuration of the beam combiner element 34, which is the same as that of the beam combiner element 34 of the laser exposure system 1 shown in FIG. 1, will not be described again here.

4.1 Beam Combiner Element Including a Diffractive Optical Element

Figure 2:
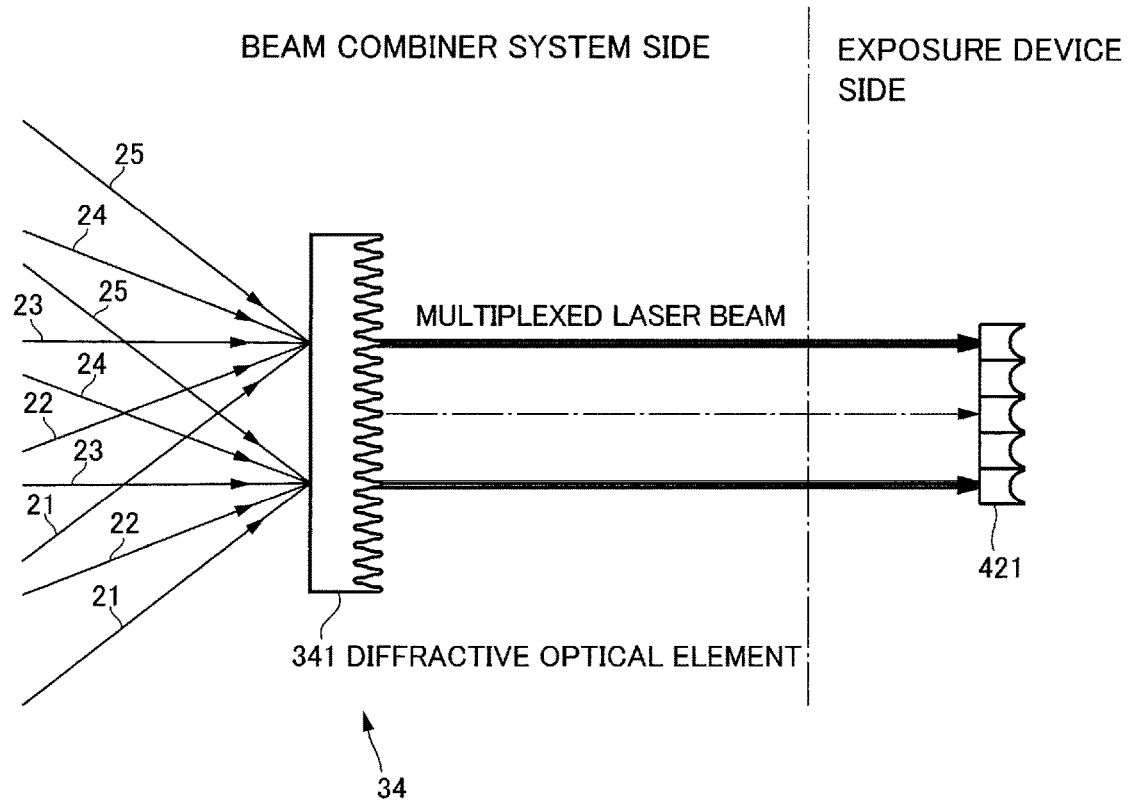
FIG. 2 is a drawing explaining a beam combiner element including a diffractive optical element.

FIG. 2 is a drawing explaining the beam combiner element 34 including the diffractive optical element 341. Here, the high-reflection mirror 41 in the exposure device 4 is not shown in FIG. 2.

The diffractive optical element 341 may be formed by making grooves in a predetermined shape at a predetermined interval on a substrate made of, for example, synthetic silica or calcium fluoride which allows ultraviolet light to transmit therethrough. The grooves may be formed in the diffractive optical element 341 such that the plurality of laser beams having entered the diffractive optical element 341 at a predetermined angle have approximately the same optical path axis when the plurality of laser beams exit the diffractive optical element 341. The plurality of laser beams having entered the diffractive optical element 341 may be multiplexed to have approximately the same optical path axis, and emitted from the diffractive optical element 341, and then reach the incident surface of the fly-eye lens 421. The diffractive optical element 341 may be, for example, the diffractive optical element described in U.S. Patent Application Publication No. 2009/0285076.

The beam combiner element 34 may be constituted by the diffractive optical element 341, and therefore multiplex the plurality of laser beams outputted from the plurality of laser devices 2 with high efficiency. By this means, the laser exposure system 1 can employ the configuration of the exposure device 4 which is the same as the configuration of an exposure device of a laser exposure system including one laser device, and therefore be easily realized at low cost. Here, the other configuration of the beam combiner element 34 including the diffractive optical element 341 may be the same as the configuration of the beam combiner element 34 shown in FIG. 1.

4.2 Beam Combiner Element Including an Integrator Optical System

Figure 3:
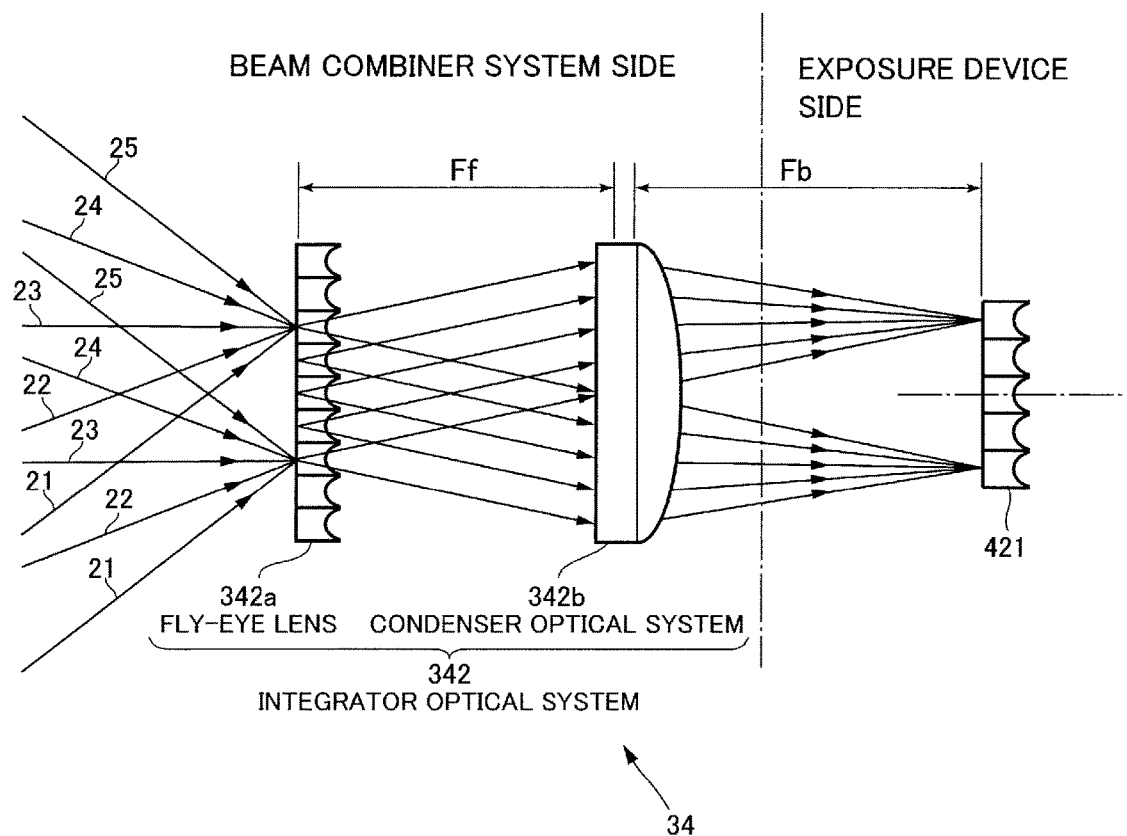
FIG. 3 is a drawing explaining a beam combiner element including an integrator optical system.

FIG. 3 is a drawing explaining the beam combiner element 34 including the integrator optical system 342. Here, the high-reflection mirror 41 in the exposure device 4 is not shown in FIG. 3. The integrator optical system 342 may be an optical system configured to superpose the plurality of laser beams outputted from the plurality of laser devices 2. The integrator optical system 342 may include a fly-eye lens 342a, and a condenser optical system 342b.

The fly-eye lens 342a may be formed by arranging a plurality of lenses on a substrate made of, for example, synthetic silica or calcium fluoride which allows ultraviolet light to transmit therethrough. The plurality of lenses included in the fly-eye lens 342a may be configured to divide and diffuse the laser beams having entered the fly-eye lens 342a at a predetermined angle and emit the laser beams from the fly-eye lens 342a. The fly-eye lens 342a may be disposed such that the position of a plurality of focal points of the fly-eye lens 342a substantially coincides with the position of the front focal plane of the condenser optical system 342b. The fly-eye lens 342a may be disposed such that the position of the incident surface of the fly-eye lens 342a substantially coincides with the position of the back focal plane of the condenser optical system 332. The fly-eye lens 342a may be disposed such that the plurality of laser beams emitted from the condenser optical system 332 enters the fly-eye lens 342a at a predetermined angle. Upon entering the fly-eye lens 342a, the plurality of laser beams are superposed on the incident surface of the fly-eye lens 342a. The laser beams having entered the fly-eye lens 342a may be divided into a number of laser beams which corresponds to the number of lenses included in the fly-eye lens 342a. The laser beams divided by the fly-eye lens 342a may be diffused at a spread angle corresponding to the size of each of the plurality of lenses, and enter the condenser optical system 342b. In this way, the fly-eye lens 342a having received the laser beams may serve as a set of a number of point sources as secondary light sources for the received laser beams. Here, exemplary configurations of the plurality of lenses included in the fly-eye lens 342a will be described later with reference to FIGS. 14A and 14B.

The condenser optical system 342b may be disposed such that the position of the front focal plane of the condenser optical system 342b substantially coincides with the position of the focal points of the fly-eye lens 342a. The condenser optical system 342b may be disposed such that the position of the back focal plane of the condenser optical system 342b substantially coincides with the position of the incident surface of the fly-eye lens 421 of the exposure device 4. The condenser optical system 342b may be disposed such that the laser beams emitted from the fly-eye lens 342a enter the condenser optical system 342b at a predetermined angle. The laser beams having been divided by the fly-eye lens 342a and entered the condenser optical system 342b are collimated by the condenser optical system 342b, and superposed again on the incident surface of the fly-eye lens 421 of the exposure device 4. As a result, the laser beams superposed on the incident surface of the fly-eye lens 421 of the exposure device 4 may become a laser beam whose light intensity distribution in the beam cross-section is further uniformed. That is, the integrator optical system 342 superposes the plurality of laser beams outputted from the plurality of laser devices 2 so that the superposed laser beams have approximately the same optical path on the incident surface of the fly-eye lens 421. Therefore, the integrator optical system 342 can further uniform the light intensity distribution in the beam cross-section of the laser beam.

The beam combiner element 34 may be constituted by the integrator optical system 342, and therefore multiplex the plurality of laser beams outputted from the plurality of laser devices 2 with high efficiency. Moreover, the beam combiner element 34 can uniform the light intensity distribution in the beam cross-section of the multiplexed laser beams more than when the diffractive optical element 341 is employed. By this means, it is possible to more easily achieve the laser exposure system 1 at lower cost than when the diffractive optical element 341 is employed. Here, the integrator optical system 342 may be formed by combining a plurality of rod lenses, instead of the fly-eye lens 342a. In addition, the other configuration of the beam combiner element 34 including the integrator optical system 342 may be the same as the configuration of the beam combiner element 34 shown in FIG. 1.

5. Incident Optical System

Now, with reference to FIGS. 4 to 6, different configurations of the incident optical system 33 will be described. Here, the configurations of the incident optical system 33 shown in FIGS. 4 to 6, which are the same as that of the incident optical system 33 of the laser exposure system 1 shown in FIG. 1, will not be described again here.

5.1 Incident Optical System Including a Mirror Optical System

Figure 4:
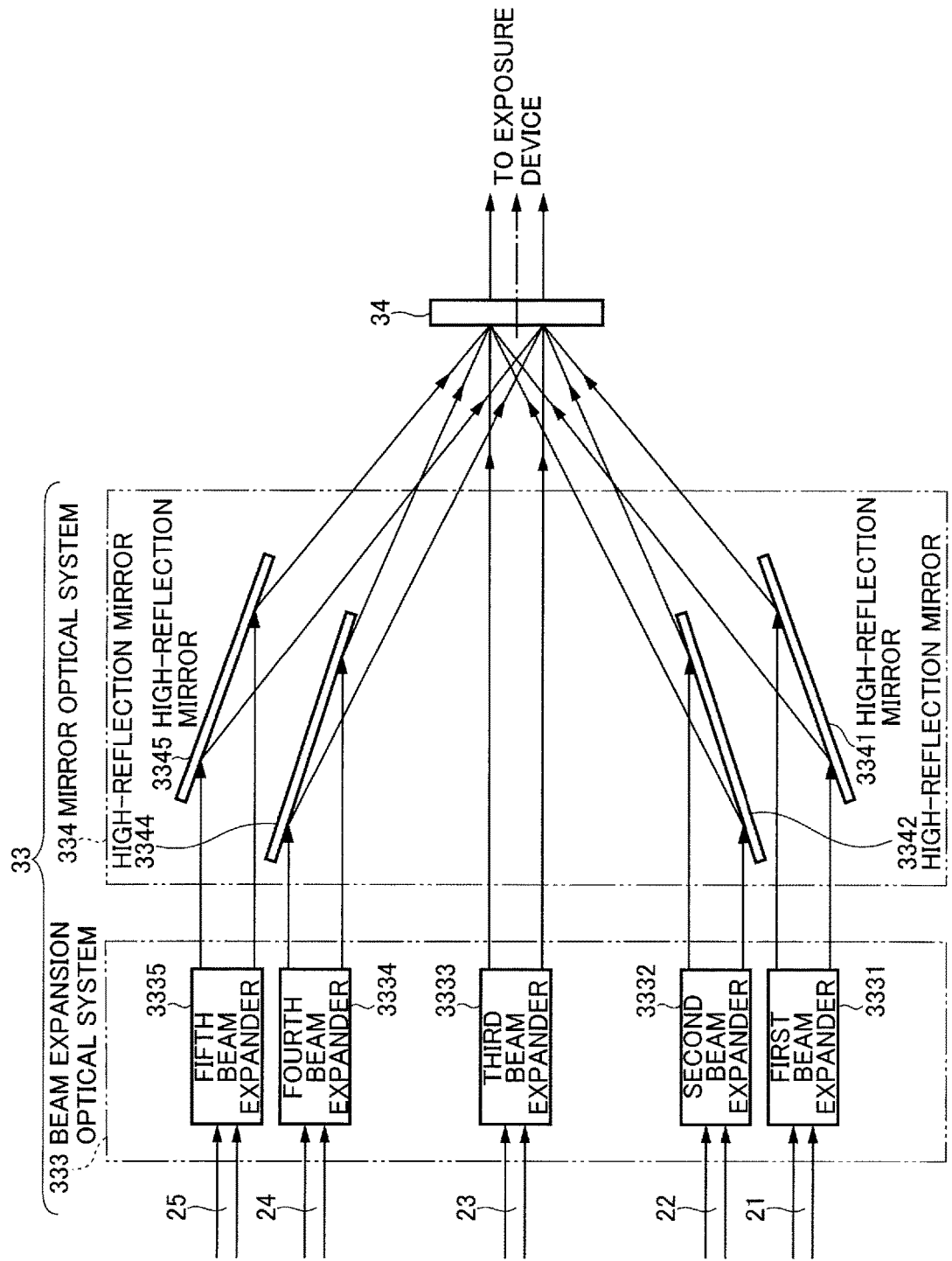
FIG. 4 is a drawing explaining an incident optical system including a mirror optical system.

FIG. 4 is a drawing explaining the incident optical system 33 including a mirror optical system 334. The incident optical system 33 shown in FIG. 4 may include a beam expansion optical system 333 and the mirror optical system 334.

The beam expansion optical system 333 may expand the plurality of laser beams outputted from the plurality of laser devices 2. The beam expansion optical system 333 may include first to fifth beam expanders 3331 to 3335.

The first beam expander 3331 may be disposed between the first high-reflection mirrors 311*a* and 311*b* and the mirror optical system 334, on the optical path of the first laser beam 21 outputted from the first laser device 2*a*. The first beam expander 3331 may be formed by combining a convex lens and a concave lens (not shown). Alternatively, the first beam expander 3331 may be formed by combining one or more convex lenses, concave lenses, and prisms (not shown). The first beam expander 3331 may expand the first laser beam 21 having been outputted from the first laser device 2*a* and having entered the first beam expander 3331 via the first high-reflection mirrors 311*a* and 311*b*. The first beam expander 3331 may emit the first laser beam 21 increased in size to a high-reflection mirror 3341 (described later) of the mirror optical system 334.

The second beam expander 3332 may be disposed between the second high-reflection mirrors 312*a* and 312*b* and the mirror optical system 334, on the optical path of the second laser beam 22 outputted from the second laser device 2*b*. The second beam expander 3332 may be formed by combining at least a convex lens, a concave lens and a prism (not shown) in the same way as the first beam expander 3331. The second beam expander 3332 may expand the second laser beam 22 having been outputted from the second laser device 2*b* and having entered the second beam expander 3332 via the second high-reflection mirrors 312*a* and 312*b*. The second beam expander 3332 may emit the second laser beam 22 increased in size to a high-reflection mirror 3342 (described later) of the mirror optical system 334.

The third beam expander 3333 may be disposed between the third high-reflection mirrors 313*a* and 313*b* and the mirror optical system 334, on the optical path of the third laser beam 23 outputted from the third laser device 2*c*. The third beam expander 3333 may be disposed such that the optical path axis of the third laser beam 23 emitted from the third beam expander 3333 substantially coincides with the optical path axis of the third laser beam 23 entering the beam combiner element 34. The third beam expander 3333 may be formed by combining at least a convex lens, a concave lens and a prism (not shown) in the same way as the first beam expander 3331. The third beam expander 3333 may expand the third laser beam 23 having been outputted from the third laser device 2*c* and having entered the third beam expander 3333 via the third high-reflection mirrors 313*a* and 313*b*. The third beam expander 3333 may emit the third laser beam 23 increased in size to the beam combiner element 34 not through the mirror optical system 334.

The fourth beam expander 3334 may be disposed between the fourth high-reflection mirrors 314*a* and 314*b* and the mirror optical system 334, on the optical path of the fourth laser beam 24 outputted from the fourth laser device 2*d*. The fourth beam expander 3334 may be formed by combining at least a convex lens, a concave lens and a prism (not shown) in the same way as the first beam expander 3331. The fourth beam expander 3334 may expand the fourth laser beam 24 having been outputted from the fourth laser device 2*d* and having entered the fourth beam expander 3334 via the fourth high-reflection mirrors 314*a* and 314*b*. The fourth beam expander 3334 may emit the fourth laser beam 24 increased in size to a high-reflection mirror 3344 (described later) of the mirror optical system 334.

The fifth beam expander 3335 may be disposed between the fifth high-reflection mirrors 315*a* and 315*b* and the mirror optical system 334, on the optical path of the fifth laser beam 25 outputted from the fifth laser device 2*e*. The fifth beam expander 3335 may be formed by combining at least a convex lens, a concave lens and a prism (not shown) in the same way as the first beam expander 3331. The fifth beam expander 3335 may expand the fifth laser beam 25 having been outputted from the fifth laser device 2*e* and having entered the fifth beam expander 3335 via the fifth high-reflection mirrors 315*a* and 315*b*. The fifth beam expander 3335 may emit the fifth laser beam 25 increased in size to a high-reflection mirror 3345 (described later) of the mirror optical system 334.

The magnifications of the laser beams by the first to fifth beam expanders 3331 to 3335 may be set such that the beam sizes of the first to fifth laser beams 21 to 25 are approximately the same as each other when the first to fifth laser beams 21 to 25 are superposed and enter the beam combiner element 34. The magnifications of the laser beams by the first to fifth beam expanders 3331 to 3335 may satisfy the above-described relational expression $S_c \geq n \cdot s_0$, preferably, the above-described relational expression $n \cdot S_0 \leq S_c \leq S_{max}$. The magnifications of the laser beams by the first to fifth beam expanders 3331 to 3335 may be approximately the same as each other.

The mirror optical system 334 may superpose the plurality of laser beams expanded by the beam expansion optical system 333 and allow the superposed laser beams to enter the beam combiner element 34. The mirror optical system 334 may include the high-reflection mirror 3341, the high-reflection mirror 3342, the high-reflection mirror 3344, and the high-reflection mirror 3345.

The high-reflection mirror 3341 may be disposed between the first beam expander 3331 and the beam combiner element 34, on the optical path of the first laser beam 21 outputted from the first laser device 2*a*. The high-reflection mirror 3341 may be disposed to face the first beam expander 3331 and the incident surface of the beam combiner element 34. The high-reflection mirror 3341 may reflect the first laser beam 21 emitted from the first beam expander 3331, and allow the reflected first laser beam 21 to enter the beam combiner element 34 at a predetermined angle. This predetermined angle may allow the first laser beam 21 to be multiplexed with the other laser beams by the beam combiner element 34.

The high-reflection mirror 3342 may be disposed between the second beam expander 3332 and the beam combiner element 34, on the optical path of the second laser beam 22 outputted from the second laser device 2*b*. The high-reflection mirror 3342 may be disposed to face the second beam expander 3332 and the incident surface of the beam combiner element 34. The high-reflection mirror 3342 may reflect the second laser beam 22 emitted from the second beam expander 3332, and allow the reflected second laser beam 22 to enter the beam combiner element 34 at a predetermined angle. This predetermined angle may allow the second laser beam 22 to be multiplexed with the other laser beams by the beam combiner element 34.

The high-reflection mirror 3344 may be disposed between the fourth beam expander 3334 and the beam combiner element 34, on the optical path of the fourth laser beam 24 outputted from the fourth laser device 2d. The high-reflection mirror 3344 may be disposed to face the fourth beam expander 3334 and the incident surface of the beam combiner element 34. The high-reflection mirror 3344 may reflect the fourth laser beam 24 emitted from the fourth beam expander 3334, and allow the reflected fourth laser beam 24 to enter the beam combiner element 34 at a predetermined angle. This predetermined angle may allow the fourth laser beam 24 to be multiplexed with the other laser beams by the beam combiner element 34.

The high-reflection mirror 3345 may be disposed between the fifth beam expander 3335 and the beam combiner element 34, on the optical path of the fifth laser beam 25 outputted from the fifth laser device 2e. The high-reflection mirror 3345 may be disposed to face the fifth beam expander 3335 and the incident surface of the beam combiner element 34. The high-reflection mirror 3345 may reflect the fifth laser beam 25 emitted from the fifth beam expander 3335, and allow the reflected fifth laser beam 25 to enter the beam combiner element 34 at a predetermined angle. This predetermined angle may allow the fifth laser beam 25 to be multiplexed with the other laser beams by the beam combiner element 34.

The plurality of laser beams having entered the beam expansion optical system 333 may be expanded so that the shapes of the laser beams are approximately the same as each other when the laser beams enter the beam combiner element 34. Then, the expanded laser beams may enter the mirror optical system 334. The plurality of laser beams having entered the mirror optical system 334 may be reflected from the mirror optical system 334, and emitted to the beam combiner element 34 while being superposed on the incident surface of the beam combiner element 34. At this time, the plurality of laser beams may enter the incident surface of the beam combiner element 34 at a predetermined angle. Here, the other configuration of the incident optical system 33 including the mirror optical system 334 may be the same as the configuration of the incident optical system 33 shown in FIG. 1.

5.2 Incident Optical System Including a Prism Optical System

Figure 5:
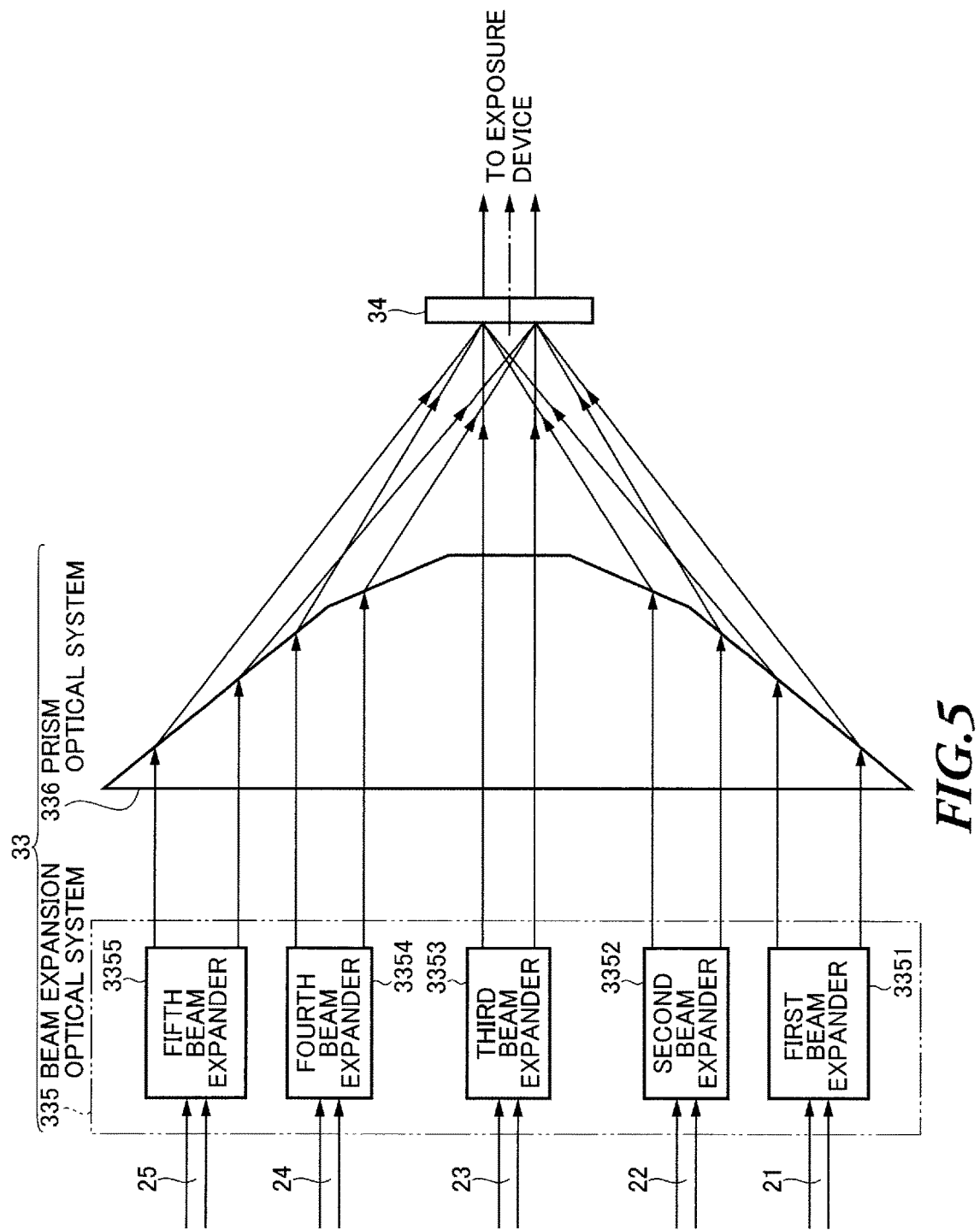
FIG. 5 is a drawing explaining an incident optical system including a prism optical system.

FIG. 5 is a drawing explaining the incident optical system 33 including a prism optical system 336. The incident optical system 33 shown in FIG. 5 may include a beam expansion optical system 335 and the prism optical system 336.

The beam expansion optical system 335 may expand the plurality of laser beams outputted from the plurality of laser devices 2, in the same way as the beam expansion optical system 333 shown in FIG. 4. The beam expansion optical system 335 may include the first to fifth beam expanders 3351 to 3355.

The first beam expander 3351 may be disposed between the first high-reflection mirrors 311a and 311b and the prism optical system 336, on the optical path of the first laser beam 21 outputted from the first laser device 2a. The first beam expander 3351 may be formed by combining a convex lens and a concave lens (not shown). Alternatively, the first beam expander 3351 may be formed by combining one or more convex lenses, concave lenses, and prisms (not shown). The first beam expander 3351 may expand the first laser beam 21 having been outputted from the first laser device 2a and having entered the first beam expander 3351 via the first high-reflection mirrors 311a and 311b. The first beam expander 3351 may emit the first laser beam 21 increased in size to the prism optical system 336.

The second beam expander 3352 may be disposed between the second high-reflection mirrors 312a and 312b and the prism optical system 336, on the optical path of the second laser beam 22 outputted from the second laser device 2b. The second beam expander 3352 may be formed by combining at least a convex lens, a concave lens, and a prism (not shown), in the same way as the first beam expander 3351. The second beam expander 3352 may expand the second laser beam 22 having been outputted from the second laser device 2b and having entered the second beam expander 3352 via the second high-reflection mirrors 312a and 312b. The second beam expander 3352 may emit the second laser beam 22 increased in size to the prism optical system 336.

The third beam expander 3353 may be disposed between the third high-reflection mirrors 313a and 313b and the prism optical system 336, on the optical path of the third laser beam 23 outputted from the third laser device 2c. The third beam expander 3353 may be disposed such that the optical path axis of the third laser beam 23 emitted from the third beam expander 3353 substantially coincides with the optical path axis of the third laser beam 23 entering the beam combiner element 34. The third beam expander 3353 may be formed by combining at least a convex lens, a concave lens, and a prism (not shown), in the same way as the first beam expander 3351. The third beam expander 3353 may expand the third laser bream 23 having been outputted from the third laser device 2c and having entered the third beam expander 3353 via the third high-reflection mirrors 313a and 313b. The third beam expander 3353 may emit the third laser beam 23 increased in size to the prism optical system 336.

The fourth beam expander 3354 may be disposed between the fourth high-reflection mirrors 314a and 314b and the prism optical system 336, on the optical path of the fourth laser beam 24 outputted from the fourth laser device 2d. The fourth beam expander 3354 may be formed by combining at least a convex lens, a concave lens, and a prism (not shown), in the same way as the first beam expander 3351. The fourth beam expander 3354 may expand the fourth laser beam 24 having been outputted from the fourth laser device 2d and having entered the fourth beam expander 3354 via the fourth high-reflection mirrors 314a and 314b. The fourth beam expander 3354 may emit the fourth laser beam 24 increased in size to the prism optical system 336.

The fifth beam expander 3355 may be disposed between the fifth high-reflection mirrors 315a and 315b and the prism optical system 336, on the optical path of the fifth laser beam 25 outputted from the fifth laser device 2e. The fifth beam expander 3355 may be formed by combining at least a convex lens, a concave lens, and a prism (not shown), in the same way as the first beam expander 3351. The fifth beam expander 3355 may expand the fifth laser beam 25 having been outputted from the fifth laser device 2e and having entered the fifth beam expander 3355 via the fifth high-reflection mirrors 315a and 315b. The fifth beam expander 3355 may emit the fifth laser beam 25 increased in size to the prism optical system 336.

The magnifications of the laser beams by the first to fifth beam expanders 3351 to 3355 may be set such that the beam sizes of the first to fifth laser beams 21 to 25 are approximately the same as each other when the first to fifth laser beams 21 to 25 are superposed and enter the incident surface of the beam combiner element 34. The magnifications of the laser beams by the first to fifth beam expanders 3351 to 3355 may satisfy the above-described relational expression $S_c \geq n \cdot S_0$, preferably, the above-described relational expression $n \cdot S_0 \leq S_c \leq S_{max}$. The magnifications of the laser beams by the first to fifth expanders 3351 to 3355 may be different from each other.

The prism optical system 336 may superpose the plurality of laser beams expanded by the beam expansion optical system 335 and allow the superposed laser beams to enter the beam combiner element 34. The prism optical system 336 may be formed by using a material made of, for example, synthetic silica or calcium fluoride which allows ultraviolet light to transmit therethrough. The prism optical system 336 may be formed as a hexagonal prism. The prism optical system 336 may be disposed between the beam expansion optical system 335 and the beam combiner element 34, on the optical paths of the plurality of laser beams outputted from the plurality of laser devices 2. The prism optical system 336 may refract the first to fifth laser beams 21 to 25 emitted from the first to fifth beam expanders 3351 to 3355, and allow the refracted laser beams to enter the incident surface of the beam combiner element 34 at a predetermined angle. This predetermined angle may allow the first to fifth laser beams 21 to 25 to be multiplexed by the beam combiner element 34.

The plurality of laser beams having entered the beam expansion optical system 335 may be expanded so that the sizes of the laser beams are approximately the same as each other when the laser beams enter the incident surface of the beam combiner element 34. Then, the expanded laser beams may enter the prism optical system 336. The plurality of laser beams having entered the prism optical system 336 may be refracted by the prism optical system 336, and enter the beam combiner element 34 while being superposed on the incident surface of the beam combiner element 34. At this time, the plurality of laser beams may enter the incident surface of the beam combiner element 34 at a predetermined angle. Here, the other configuration of the incident optical system 33 including the prism optical system 336 may be the same as the configuration of the incident optical system 33 shown in FIG. 1.

5.3 Incident Optical System for Converting Beams Into Parallel Beams

Figure 6:
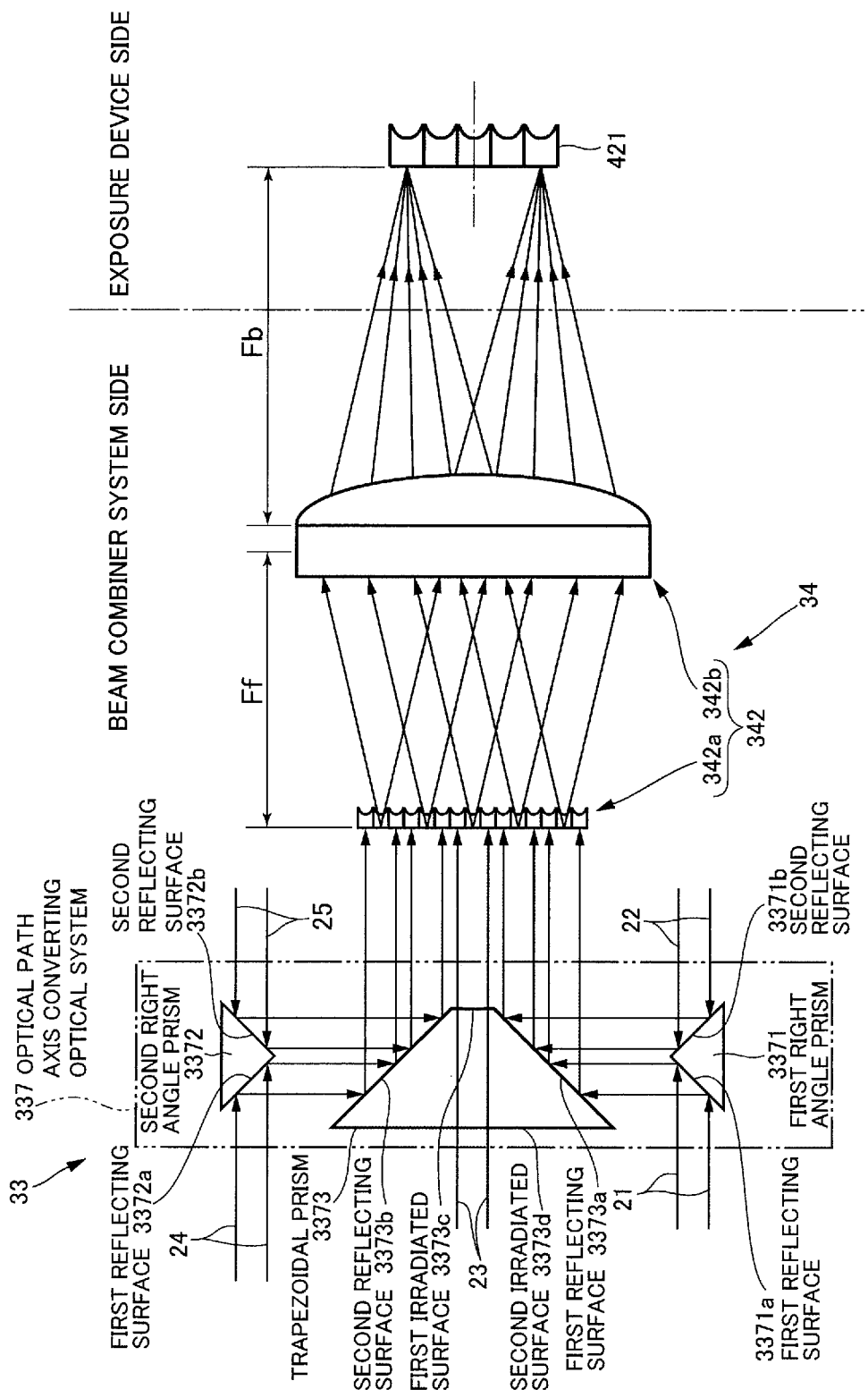
FIG. 6 is a drawing explaining an incident optical system for converting beams into parallel beams.

FIG. 6 is a drawing explaining the incident optical system 33 for converting beams into parallel beams. Here, the high-reflection mirror 41 in the exposure device 4 is not shown in FIG. 6.

The incident optical system 33 shown in FIG. 6 may allow the plurality of laser beams outputted from the plurality of laser devices 2 to enter the beam combiner element 34 without the superposition on the incident surface of the beam combiner element 34, differently from the incident optical system 33 shown in FIGS. 1 to 5. The incident optical system 33 shown in FIG. 6 may convert the plurality of laser beams outputted from the plurality of laser devices 2 into beams having optical path axes parallel to each other, and allow the beams to enter the beam combiner element 34. The incident optical system 33 shown in FIG. 6 may be appropriate for a case where the plurality of laser beams enter the beam combiner element 34 including the integrator optical system 342 shown in FIG. 3. The incident optical system 33 shown in FIG. 6 may include an optical path axis converting optical system 337.

The optical path axis converting optical system 337 may convert the optical path axes of the plurality of laser beams outputted from the plurality of laser devices 2 into parallel axes, and allow the laser beams having the converted axes to enter the beam combiner element 34. The optical path axis converting optical system 337 may include a first right angle prism 3371, a second right angle prism 3372, and a trapezoidal prism 3373.

The first right angle prism 3371 may be formed as a triangular prism having a bottom surface of a right triangle. Two side surfaces of the first right angle prism 3371, which make a right angle with one another, may be coated with a high-reflective film. The two side surfaces of the first right angle prism 3371, which make a right angle with one another, may constitute a first reflecting surface 3371a and a second reflecting surface 3371b.

The first right angle prism 3371 may be disposed such that the first reflecting surface 3371a of the first right angle prism 3371 and a first reflecting surface 3373a (described later) of the trapezoidal prism 3373 are parallel to and face one another. The first right angle prism 3371 may be disposed such that the first reflecting surface 3371a of the first right angle prism 3371 crosses the optical path axis of the first laser beam 21 at an angle of 45 degrees. The first right angle prism 3371 may be disposed such that the second reflecting surface 3371b of the first right angle prism 3371 crosses the optical path axis of the second laser beam 22 at an angle of 45 degrees.

The second right angle prism 3372 may be formed as a triangular prism having a bottom surface of a right triangle. Two side surfaces of the second right angle prism 3372, which make a right angle with one another, may be coated with a high-reflective film. The two side surfaces of the second right angle prism 3372, which make a right angle with one another, may constitute a first reflecting surface 3372a and a second reflecting surface 3372b.

The second right angle prism 3372 may be disposed such that the first reflecting surface 3372a of the second right angle prism 3372 and a second reflecting surface 3373b (described later) of the trapezoidal prism 3373 are parallel to and face one another. The second right angle prism 3372 may be disposed such that the first reflecting surface 3372a of the second right angle prism 3372 crosses the optical path axis of the fourth laser beam 24 at an angle of 45 degrees. The second right angle prism 3372 may be disposed such that the second reflecting surface 3372b of the second right angle prism 3372 crosses the optical path axis of the fifth laser beam 25 at an angle of 45 degrees.

The trapezoidal prism 3373 may be formed by using a material made of, for example, synthetic silica or calcium fluoride which allows ultraviolet light to transmit therethrough. The trapezoidal prism 3373 may be formed as a quadrangular prism. The trapezoidal prism 3373 may have a bottom surface formed as an isosceles trapezoid having two opposite legs making a right angle. Side surfaces of the trapezoidal prism 3373, which abut on the two opposite legs of the isosceles trapezoidal bottom surface, may be coated with a high-reflective film. The side surfaces of the trapezoidal prism 3373, which abut on the two opposite legs of the isosceles trapezoidal bottom surface, may constitute a first reflecting surface 3373a and a second reflecting surface 3373b, respectively. Side surfaces of the trapezoidal prism 3373, which abut on the upper base and the lower base of the isosceles trapezoidal bottom surface, may be coated with an antireflection film. The side surfaces of the trapezoidal prism 3373, which abut on the upper base and the lower base of the isosceles trapezoidal bottom surface, may constitute a first irradiated surface 3373c and a second irradiated surface 3373d, respectively.

The trapezoidal prism 3373 may be disposed such that the second irradiated surface 3373d of the trapezoidal prism 3373 is orthogonal to the optical path axis of the third laser beam 23. The trapezoidal prism 3373 may be disposed such that the first reflecting surface 3373a of the trapezoidal prism 3373 makes an angle of 45 degrees with the incident surface of the fly-eye lens 342a of the integrator optical system 342. The trapezoidal prism 3373 may be disposed such that the second reflecting surface 3373b of the trapezoidal prism 3373 makes an angle of 45 degrees with the incident surface of the fly-eye lens 342a of the integrator optical system 342.

The first laser beam 21 outputted from the first laser device 2a may be reflected from the first reflecting surface 3371a of the first right angle prism 3371, and reach the first reflecting surface 3373a of the trapezoidal prism 3373. The first laser beam 21 reaching the first reflecting surface 3373a of the trapezoidal prism 3373 may be reflected from the first reflecting surface 3373a, and vertically enter the incident surface of the fly-eye lens 342a. At this time, the optical path axis of the first laser beam 21 having entered the fly-eye lens 342a may be parallel to the optical path axes of the other laser beams.

The second laser beam 22 outputted from the second laser device 2b may be reflected from the second reflecting surface 3371b of the first right angle prism 3371, and reach the first reflecting surface 3373a of the trapezoidal prism 3373. The second laser beam 22 reaching the first reflecting surface 3373a of the trapezoidal prism 3373 may be reflected from the first reflecting surface 3373a, and vertically enter the incident surface of the fly-eye lens 342a. At this time, the optical path axis of the second laser beam 22 having entered the fly-eye lens 342a may be parallel to the optical path axes of the other laser beams.

The third laser beam 23 outputted from the third laser device 2c may enter the second irradiated surface 3373d of the trapezoidal prism 3373, and travel straight through the trapezoidal prism 3373. The third laser beam 23 having traveled straight through the trapezoidal prism 3373 may be emitted from the first irradiated surface 3373c, and vertically enter the incident surface of the fly-eye lens 342a. At this time, the optical path axis of the third laser beam 23 having entered the fly-eye lens 342a may be parallel to the optical path axes of the other laser beams.

The fourth laser beam 24 outputted from the fourth laser device 2d may be reflected from the first reflecting surface 3372a of the second right angle prism 3372, and reach the second reflecting surface 3373b of the trapezoidal prism 3373. The fourth laser beam 24 reaching the second reflecting surface 3373b of the trapezoidal prism 3373 may be reflected from the second reflecting surface 3373b, and vertically enter the incident surface of the fly-eye lens 342a. At this time, the optical path axis of the fourth laser beam 24 having entered the fly-eye lens 342a may be parallel to the optical path axes of the other laser beams.

The fifth laser beam 25 outputted from the fifth laser device 2e may be reflected from the second reflecting surface 3372b of the second right angle prism 3372, and reach the second reflecting surface 3373b of the trapezoidal prism 3373. The fifth laser beam 25 reaching the second reflecting surface 3373b of the trapezoidal prism 3373 may be reflected from the second reflecting surface 3373b, and vertically enter the incident surface of the fly-eye lens 342a.

At this time, the optical path axis of the fifth laser beam 25 having entered the fly-eye lens 342a may be parallel to the optical path axes of the other laser beams.

As described above, the optical path axis converting optical system 337 can convert the optical path axes of the first to fifth laser beams 21 to 25 into parallel optical path axes. Then, the optical path axis converting optical system 337 allows the first to fifth laser beams 21 to 25 whose optical path axes parallel to each other to enter the fly-eye lens 342a of the integrator optical system 342.

The first to fifth laser beams 21 to 25 having been emitted from the optical path axis converting optical system 337 and having entered the fly-eye lens 342a can be divided into a number of laser beams and diffused by the fly-eye lens 342a, and then enter the condenser optical system 342b, as described with reference to FIG. 3. Then, the first to fifth laser beams 21 to 25 having entered the condenser optical system 342b may be collimated by the condenser optical system 342b, and multiplexed on the incident surface of the fly-eye lens 421 of the exposure device 4, as described with reference to FIG. 3. That is, the laser system 5 including the incident optical system 33 and the beam combiner element 34 shown in FIG. 6 can multiplex the plurality of laser beams, even though the plurality of laser beams are not superposed on the incident surface of the beam combiner element 34. Here, the other configuration of the incident optical system 33 for converting beams into parallel beams may be the same as the configuration of the incident optical system 33 shown in FIG. 1.

6. Beam Property Adjustment Unit

Now, with reference to FIGS. 7 to 9, the detailed configuration of the beam property adjustment unit 32 will be described. The beam property adjustment unit 32 may be constituted by an optical path length adjustment unit 321 and a beam transfer unit 322. The configuration of the beam property adjustment unit 32, which is the same as that of the beam property adjustment unit 32 of the laser exposure system 1 shown in FIG. 1, will not be described again here.

Figure 7:
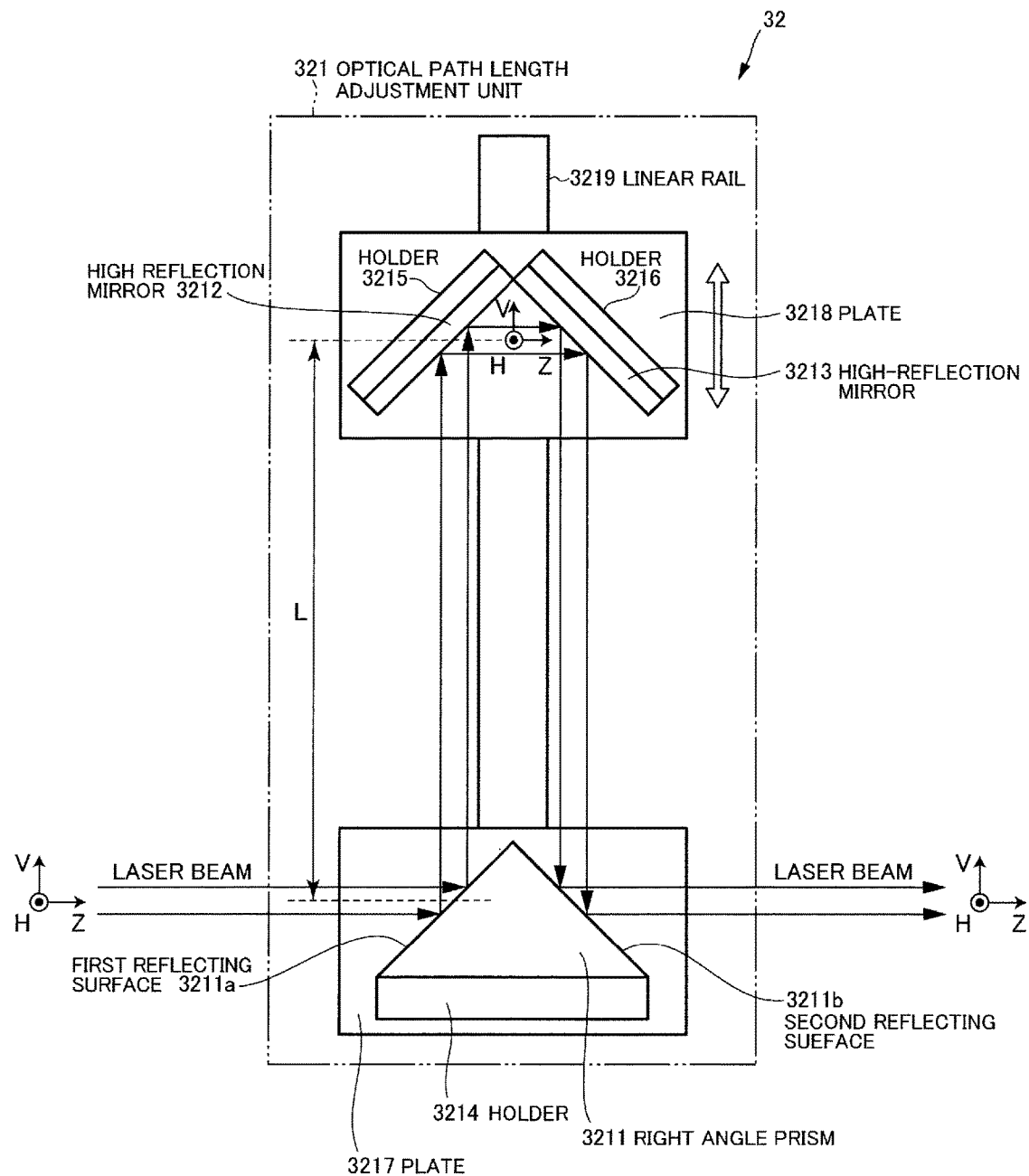
FIG. 7 is a drawing explaining a beam property adjustment unit including an optical path length adjustment unit.

6.1 Beam Property Adjustment Unit Including an Optical Path Length Adjustment Unit FIG. 7 is a drawing explaining the beam property adjustment unit 32 including the optical path length adjustment unit 321. In FIG. 7, the traveling direction of a laser beam is defined as a Z-axis direction. The opposite direction of the direction of gravity is defined as a V-axis direction. The horizontal direction is defined as an H-axis direction. The same applies to subsequent drawings.

The optical path length adjustment unit 321 may be provided for each of the first to fourth beam property adjustment units 32a to 32d of the beam property adjustment unit 32 shown in FIG. 1. The optical path length adjustment unit 321 for each of the first to fourth beam property adjustment units 32a to 32d may be a substantially identical optical path length adjustment unit. Hereinafter, the optical path length adjustment unit 321 of the first beam property adjustment unit 32a disposed on the optical path of the first laser beam 21 will be described as an example.

The optical path length adjustment unit 321 may include a right angle prism 3211, a high-reflection mirror 3212, a high-reflection mirror 3213, a holder 3214, a holder 3215, a holder 3216, a plate 3217, a plate 3218, and a linear rail 3219.

The right angle prism 3211 may be formed as a triangular prism having a bottom surface of a right triangle. Two side surfaces of the right angle prism 3211, which make a right angle with one another, may be coated with a high-reflective film. The two side surfaces of the right angle prism 3211, which make a right angle with one another, may constitute a first reflecting surface 3211a and a second reflecting surface 3211b.

The right angle prism 3211 may be disposed such that the first reflecting surface 3211a of the right angle prism 3211 crosses the optical path axis of the first laser beam 21 having entered the optical path length adjustment unit 321 at an angle of 45 degrees. The right angle prism 3211 may be disposed such that the second reflecting surface 3211b of the right angle prism 3211 makes an angle of 45 degrees with the optical path axis of the first laser beam 21 having entered the optical path length adjustment unit 321.

The high-reflection mirror 3212 may be disposed such that the reflecting surface of the high-reflection mirror 3212 faces the first reflecting surface 3211a of the right angle prism 3211 in parallel to one another. The high-reflection mirror 3212 may be disposed such that the reflecting surface of the high-reflection mirror 3212 faces the reflecting surface of the high-reflection mirror 3213 to make a right angle with one another.

The high-reflection mirror 3213 may be disposed such that the reflecting surface of the high-reflection mirror 3213 faces the second reflecting surface 3211b of the right angle prism 3211 in parallel to one another. The high-reflection mirror 3213 may be disposed such that the reflecting surface of the high-reflection mirror 3213 faces the reflecting surface of the high-reflection mirror 3212 to make a right angle with one another.

The holder 3214 may hold the right angle prism 3211. The holder 3214 may be fixed to the plate 3217. The holder 3215 and the holder 3216 may hold the high-reflection mirror 3212 and the high-reflection mirror 3213, respectively. The holder 3215 and the holder 3216 may be fixed to the plate 3218. The plate 3218 may be attached to the linear rail 3219. The linear rail 3219 may move the plate 3218 in the direction orthogonal to the optical path axis of the first laser beam 21 having entered the optical path length adjustment unit 321. The linear rail 3219 may move the plate 3218 according to the control from a laser controller (not shown). By this means, a distance L between the high-reflection mirrors 3212 and 3213 and the right angle prism 3211 may be changed to adjust the optical path length of the first laser beam 21.

The first laser beam 21 having entered the optical path length adjustment unit 321 may be reflected from the first reflecting surface 3211a of the right angle prism 3211, and reach the reflecting surface of the high-reflection mirror 3212. The first laser beam 21 reaching the reflecting surface of the high-reflection mirror 3212 may be reflected from the reflecting surface of the high-reflection mirror 3212, and reach the reflecting surface of the high-reflection mirror 3213. The first laser beam 21 reaching the reflecting surface of the high-reflection mirror 3213 may be reflected from the reflecting surface of the high-reflection mirror 3213, and reach the second reflecting surface 3211b of the right angle prism 3211. The first laser beam 21 reaching the second reflecting surface 3211b of the right angle prism 3211 may be reflected from the second reflecting surface 3211b, and be emitted. At this time, the optical path axis of the first laser beam 21 substantially coincides with the extension of the optical path axis of the first laser beam 21 having entered the optical path length adjustment unit 321. The optical path length of the first laser beam 21 having passed through the optical path length adjustment unit 321 may be increased by about 2 L as compared to the optical path length of the first laser beam 21 without passing through the optical path length adjustment unit 321. Here, the optical path length adjustment unit 321 reflects the first laser beam 21 having entered the optical path length adjustment unit 321 from an even number of reflecting surfaces. Therefore, it is possible to emit the first laser beam 21 from the optical path length adjustment unit 321 without inverting the first laser beam 21. Here, the other configuration of the beam property adjustment unit 32 including the optical path length adjustment unit 321 may be the same as the configuration of the beam property adjustment unit 32 shown in FIG. 1.

6.2 Beam Property Adjustment Unit Including a Beam Transfer Unit

Figure 8:
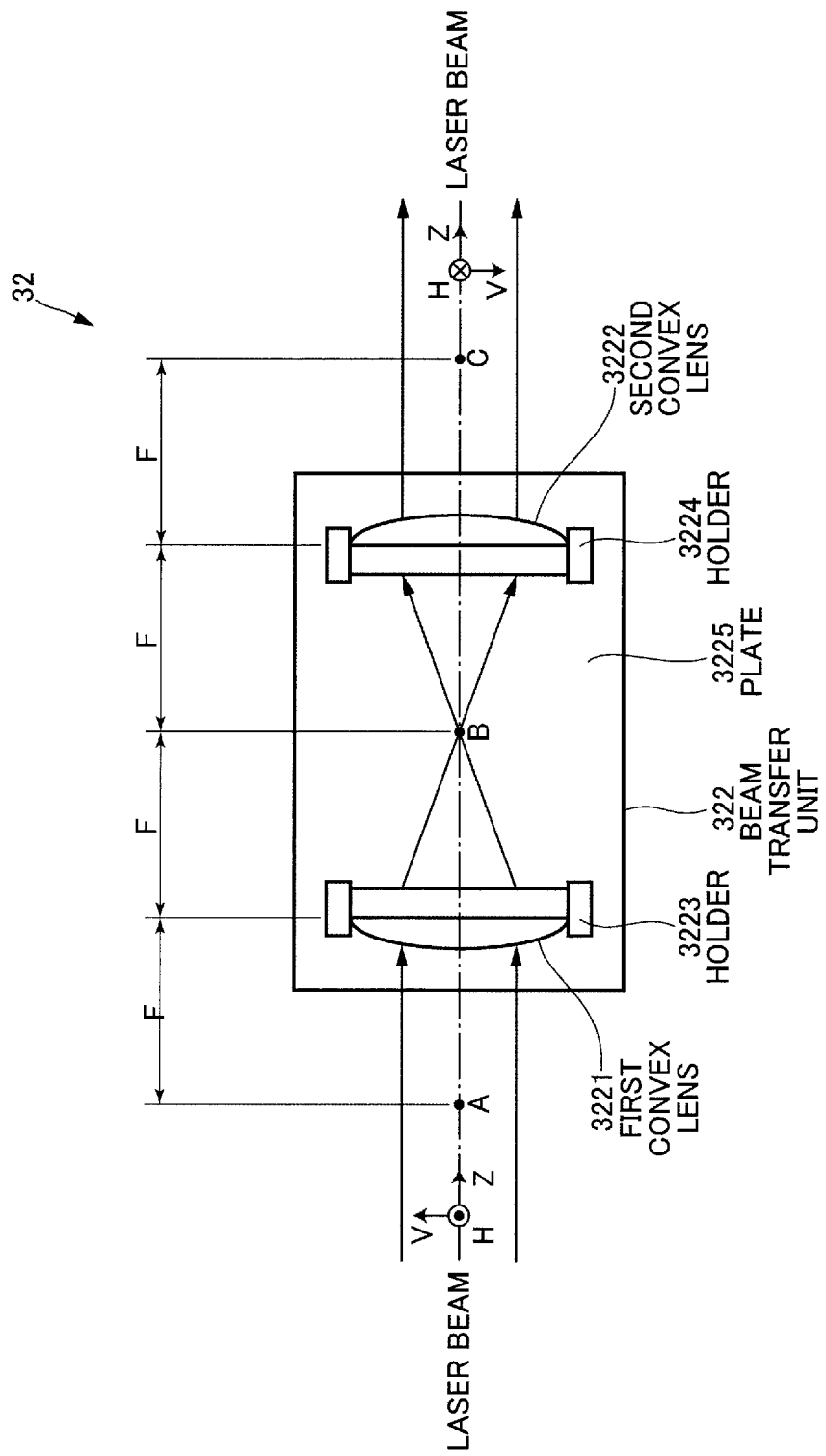
FIG. 8 is a drawing explaining a beam property adjustment unit including a beam transfer unit.

FIG. 8 is a drawing explaining the beam property adjustment unit 32 including a beam transfer unit 322. The beam transfer unit 322 may be provided for each of the first to fourth beam property adjustment units 32a to 32d of the beam property adjustment unit 32 shown in FIG. 1. The beam transfer unit 322 for each of the first to fourth beam property adjustment units 32a to 32d may be a substantially identical beam transfer unit. Hereinafter, the beam transfer unit 322 of the first beam property adjustment unit 32a disposed on the optical path of the first laser beam 21 will be described as an example.

The beam transfer unit 322 may include a first convex lens 3221, a second convex lens 3222, a holder 3223, a holder 3224, and a plate 3225.

The first convex lens 3221 and the second convex lens 3222 may be formed by using a material made of, for example, synthetic silica or calcium fluoride which allows ultraviolet light to transmit therethrough. The first convex lens 3221 and the second convex lens 3222 may have approximately the same focal distance F. The first convex lens 3221 and the second convex lens 3222 may face one another while being spaced from one another by a distance which is twice as long as the focal distance F. The first convex lens 3221 and the second convex lens 3222 may be disposed such that the position of the back focal point of the first convex lens 3221 may substantially coincide with the position of the front focal point of the second convex lens 3222. The first convex lens 3221 and the second convex lens 3222 may be disposed such that the optical path axes of the first convex lens 3221 and the second convex lens 3222 substantially coincide with the optical path axis of the first laser beam 21.

The holder 3223 may hold the first convex lens 3221. The holder 3223 may be fixed to the plate 3225. The holder 3224 may hold the second convex lens 3222. The holder 3224 may be fixed to the plate 3225.

The first laser beam 21 having entered the beam transfer unit 322 may transmit through the first convex lens 3221. The first laser beam 21 having transmitted through the first convex lens 3221 may be focused on a position B which is the back focal point of the first convex lens 3221 and the front focal point of the second convex lens 3222. The first laser beam 21 focused on the position B corresponding to the back focal point of the first convex lens 3221 and the front focal point of the second convex lens 3222 may be diffused, and enter the second convex lens 3222. The first laser beam 21 having entered the second convex lens 3222 may transmit through the second convex lens 3222. The first laser beam 21 may be collimated by the second convex lens 3222, and exit the second convex lens 3222.

An image of the first laser beam 21 at a position A corresponding to the front focal point of the first convex lens 3221 may be transferred to and focused on a position C corresponding to the back focal point of the second convex lens 3222 at a magnification of 1:1. The distance from the position A to the position C for which the image is transferred and focused at the magnification of 1:1 may be four times as long as the focal distance F of the first convex lens 3221 and the second convex lens 3222. At this time, the image of the first laser beam 21 transferred and focused at the magnification of 1:1 may be inverted from the image of the first laser beam 21 having entered the beam transfer unit 322. That is, the beam transfer unit 322 may invert the first laser beam 21 having entered the beam transfer unit 322, and allow the inverted first laser beam 21 to exit the beam transfer unit 322. However, the beam profile, beam size, and beam divergence of the first laser beam 21 transferred and focused at the magnification of 1:1 may be approximately the same as the beam profile, beam size, and beam divergence of the first laser beam 21 having not been transferred and focused. Therefore, the first laser beam 21 having entered the beam transfer unit 322 may be emitted from the beam transfer unit 322 while the beam properties including the beam profile, beam size, and beam divergence of the first laser beams 21, except the optical path length, remain substantially the same. That is, even though the optical path length of the first laser beam 21 is increased by a length which is four times as long as the focal distance F, it is possible to emit the first laser beam 21 from the beam transfer unit 322 while preventing a change in the beam properties of the first laser beam 21 except the optical path length. That is, except the optical path length, the beam properties of the first laser beam 21 having passed through the beam transfer unit 322 may be approximately the same as those of the first laser beam 21 without passing through the beam transfer unit 322.

Here, although the configuration has been described where the beam transfer unit 322 employs a pair of the first convex lens 3221 and the second convex lens 3222, this is by no means limiting. Another configuration is possible where a pair of concave mirrors having the same focal distance is employed. Moreover, the number of pairs of the first convex lens 3221 and the second convex lens 3222 is not limited to one. Another configuration is possible where an even number of pairs of the first convex lenses 3221 and the second convex lenses 3222 are arranged in series. By this means, the beam transfer unit 322 may invert the first laser beam 21 having entered the beam transfer unit 322 an even number of times. As a result, the beam transfer unit 322 may allow the first laser beam 21 to exit the beam transfer unit 322 in the same direction as the direction in which the first laser beam 21 entered the beam transfer unit 322. Here, the other configuration of the beam property adjustment unit 32 including the beam transfer unit 322 may be the same as the configuration of the beam property adjustment unit 32 shown in FIG. 1.

6.3 Combination of the Configurations of the Beam Property Adjustment Unit

Figure 9:
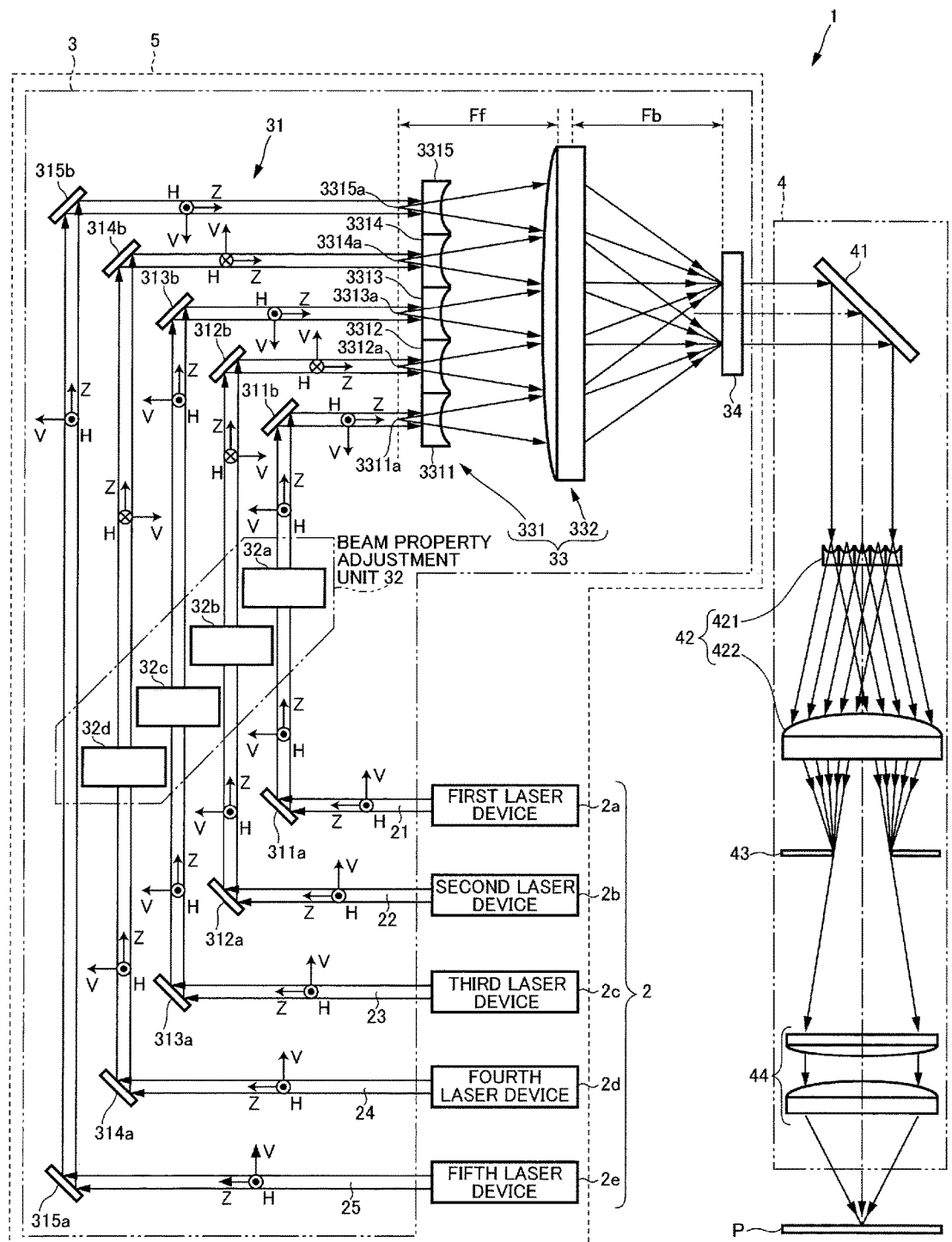
FIG. 9 is a drawing explaining a combination of different configurations of the beam property adjustment unit.

FIG. 9 is a drawing explaining a combination of the configurations of the beam property adjustment unit 32. Here, the first to fourth beam property adjustment units 32a to 32d of the beam property adjustment unit 32 may not have the same configuration.

A part of the first to fourth beam property adjustment units 32a to 32d may be configured to invert the received laser beams and emit the inverted laser beams. Such a beam property adjustment unit configured to invert the received laser beam and emit the inverted laser beam may be constituted by the beam transfer unit 322 shown in FIG. 8. The other part of the first to fourth beam property adjustment units 32a to 32d may be configured to emit the received laser beams without inverting the received laser beams. Such a beam property adjustment unit configured to emit the received laser beam without inverting the received laser beam may be constituted by the optical path length adjustment unit 321 shown in FIG. 7. Alternatively, the beam property adjustment unit configured to emit the received laser beam without inverting the received laser beam may be constituted by the beam transfer unit 322 including an even number of pairs of the first convex lenses 3221 and the second convex lenses 3222 (shown in FIG. 8) arranged in series.

The first beam property adjustment unit 32a and the third beam property adjustment unit 32c shown in FIG. 9 may be configured to emit the received laser beams without inverting the received laser beams. Meanwhile, the second beam property adjustment unit 32b and the fourth beam property adjustment unit 32d shown in FIG. 9 may be configured to invert the received laser beams and emit the inverted laser beams.

The first laser beam 21 having entered the first beam property adjustment unit 32a may be emitted from the first beam property adjustment unit 32a without being inverted, and enter the incident surface of the beam combiner element 34. The second laser beam 22 having entered the second beam property adjustment unit 32b may be inverted and emitted from the second beam property adjustment unit 32b, and then enter the incident surface of the beam combiner element 34. The third laser beam 23 having entered the third beam property adjustment unit 32c may be emitted from the third beam property adjustment unit 32c without being inverted, and enter the incident surface of the beam combiner element 34. The fourth laser beam 24 having entered the fourth beam property adjustment unit 32d may be inverted and emitted from the fourth beam property adjustment unit 32d, and then enter the incident surface of the beam combiner element 34. Here, the fifth laser beam 25 may enter the incident surface of the beam combiner element 34 without being inverted.

The first to fifth laser beams 21 to 25 having entered the incident surface of the beam combiner element 34 may be superposed as described above. At this time, on the incident surface of the beam combiner element 34, the non-inverted first, third and fifth laser beams 21, 23, and 25 may be superposed with the inverted second and fourth laser beams 22 and 24. That is, on the incident surface of the beam combiner element 34, the inverted laser beams and the non-inverted laser beams are mixed and superposed.

When the plurality of laser devices 2 are discharge excited laser devices such as excimer laser devices, the light intensity distribution in the beam cross-section of each of the outputted laser beams may not be uniform in the direction of the discharge electrodes. For example, the peak of the light intensity distribution may be higher in the anode side of the discharge electrodes than that in the cathode side. For example, when an inverted laser beam and a non-inverted laser beam are mixed and superposed, part of the beam cross-section of the inverted laser beam having a high light intensity may be superposed with part of the beam cross-section of the non-inverted laser beam having a low light intensity. Therefore, when the inverted laser beams and the non-inverted laser beams are mixed and superposed on the incident surface of the beam combiner element 34, the beam combiner element 34 can uniform the light intensity distribution in the beam cross-section of the superposed laser beams and easily multiplex the laser beams. Therefore, the light intensity distribution in the beam cross-section of the laser beam multiplexed by the beam combiner element 34 shown in FIG. 9 can be more uniform than the light intensity distribution in the beam cross-section of the laser beam multiplexed by the beam combiner element 34 shown in FIG. 1.

Here, the beam property adjustment unit 32 may invert at least one of the plurality of laser beams outputted from the plurality of laser devices 2. Preferably, the beam property adjustment unit 32 may invert about the half of the plurality of laser beams outputted from the plurality of laser devices 2. In addition, the beam property adjustment unit 32 may axisymmetrically convert at least one of the plurality of laser beams outputted from the plurality of laser devices 2, in the V-axis direction or the H-axis direction by using mirrors and so forth, instead of the inversion by using the beam transfer unit 322. Here, the other configuration of the beam property adjustment unit 32 shown in FIG. 9 may be the same as the configuration of the beam property adjustment unit 32 shown in FIG. 1.

7. Optical System in the Exposure Device

Now, with reference to FIGS. 10 to 13, different configurations of the optical system in the exposure device 4 will be described. Here, the configuration of the optical system in the exposure device 4 shown in FIGS. 10 to 13, which is the same as that of the optical system in the exposure device 4 of the laser exposure system 1 shown in FIG. 1, will not be described again here.

7.1 Illumination Optical System

Figure 10:
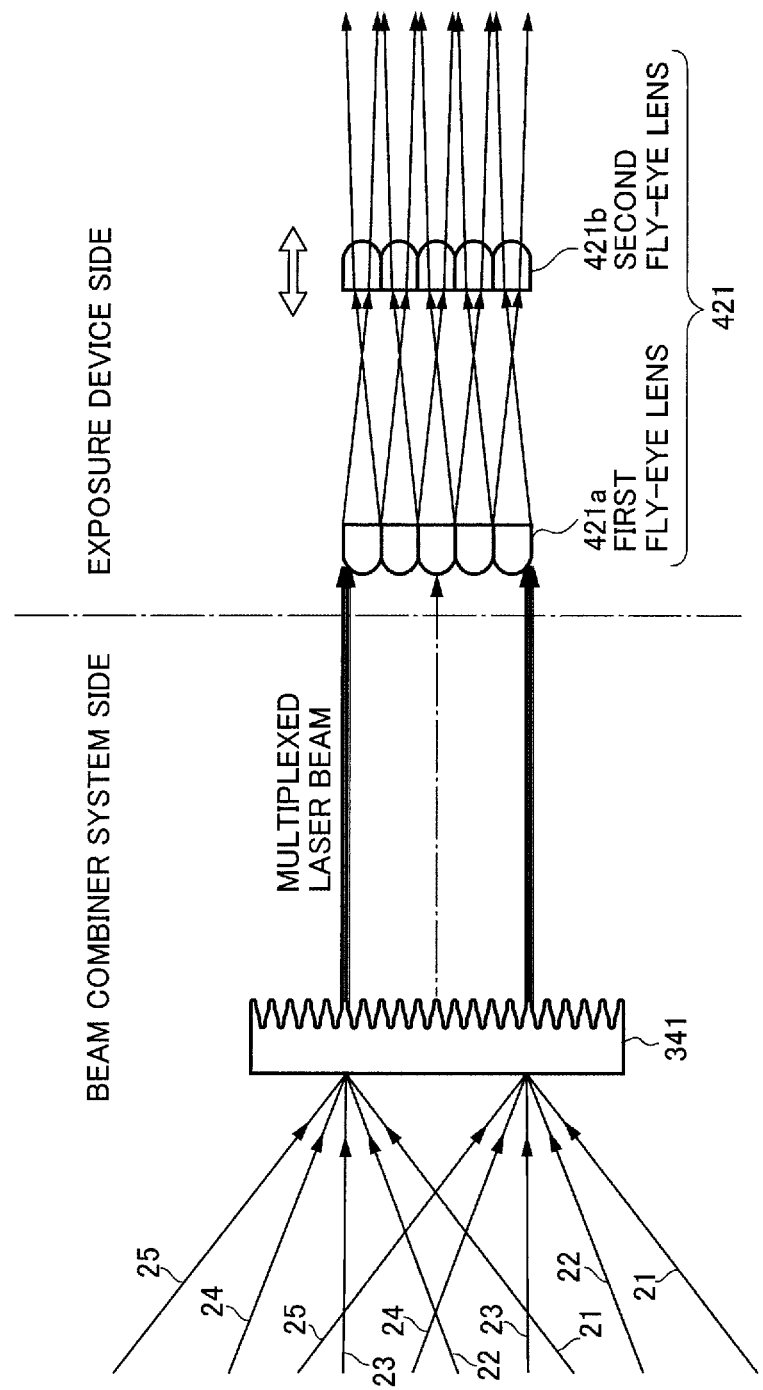
FIG. 10 is a drawing explaining another configuration of a fly-eye lens of an illumination optical system when a laser beam multiplexed by the beam combiner element including the diffractive optical element enters an exposure device.
Figure 11:
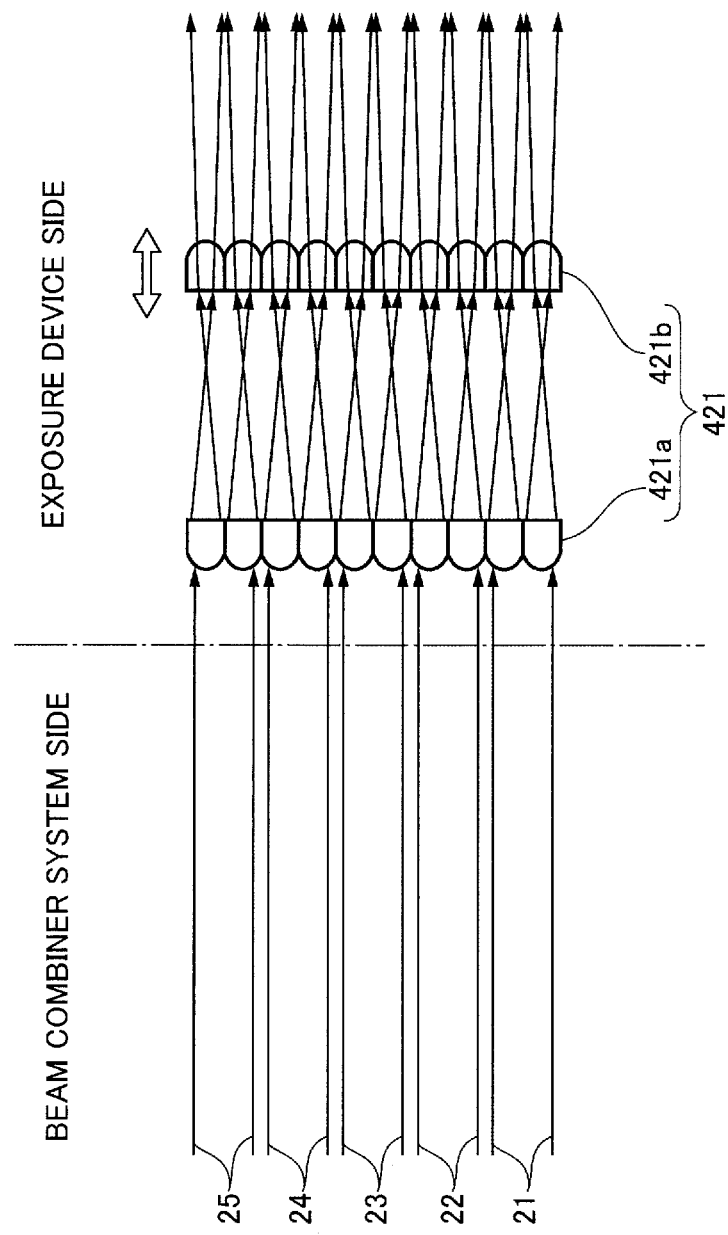
FIG. 11 is a drawing explaining further another configuration of the fly-eye lens of the illumination optical system when a plurality of laser beams converted into parallel beams enter the exposure device.

Now, with reference to FIGS. 10 and 11, different configurations of the fly-eye lens 421 of the illumination optical system 42 will be described. FIG. 10 is a drawing explaining another configuration of the fly-eye lens 421 of the illumination optical system 42 when the laser beams multiplexed by the beam combiner element 34 including the diffractive optical element 341 enter the exposure device 4. FIG. 11 is a drawing explaining further another configuration of the fly-eye lens 421 of the illumination optical system 42 when the plurality of laser beams converted into parallel beams enter the exposure device 4. Here, the high-reflection mirror 41 in the exposure device 4 is not shown in FIGS. 10 and 11.

In a case in which the laser beams multiplexed by the beam combiner element 34 including the diffractive optical element 341 enter the exposure device 4, or in which the laser beams converted into parallel beams enter the exposure device 4, the fly-eye lens 421 may have a configuration as shown in FIGS. 10 and 11. That is, the fly-eye lens 421 may include a first fly-eye lens 421a and a second fly-eye lens 421b arranged in series with each other as shown in FIGS. 10 and 11. Each of the first fly-eye lens 421a and the second fly-eye lens 421b may be formed by arranging a plurality of plano-convex lenses. The distance between the first fly-eye lens 421a and the second fly-eye lens 421b of the fly-eye lens 421 may be appropriately changed. The distance between the first fly-eye lens 421a and the second fly-eye lens 421b of the fly-eye lens 421 may be changed by moving the second fly-eye lens 421b along the optical path axes of the laser beams, based on the control of an exposure device controller (not shown) in the exposure device 4.

The laser beams having entered the exposure device 4 may enter the first fly-eye lens 421a. The laser beam having entered the first fly-eye lens 421a may be divided, and focused on the back focal plane of the plurality of plano-convex lenses of the first fly-eye lens 421a. The laser beams divided and focused by the first fly-eye lens 421a may be diffused and enter the second fly-eye lens 421b. The divided laser beams transmitting through the second fly-eye lens 421b may be adjusted to reduce the spread angle of each of the laser beams, and enter the condenser optical system 422.

Here, when the distance between the first fly-eye lens 421a and the second fly-eye lens 421b is increased, the beam size of each of the laser beams entering the second fly-eye lens 421b may be reduced. When the beam size of each of the laser beams entering the second-fly-eye lens 421b is reduced, the beam size of each of the laser beams entering the condenser optical system 422 may also be reduced. When the beam size of each of the laser beams entering the condenser optical system 422 is reduced, the beam size of each of the laser beams emitted to the back focal plane of the condenser optical system 422 may also be reduced. By this means, the laser exposure system 1 including the fly-eye lens 421 shown in FIGS. 10 and 11 can adjust the beam size of each of the laser beams with which the back focal plane of the condenser optical system 422 is irradiated.

Here, the laser exposure system 1 including the fly-eye lens 421 shown in FIG. 11 may convert the plurality of laser beams entering the fly-eye lens 421 into parallel beams, by using, for example, the optical path axis converting optical system 337 shown in FIG. 6. The other configuration of the fly-eye lens 421 shown in FIGS. 10 and 11 may be the same as the configuration of the fly-eye lens 421 shown in FIG. 1.

7.2 Line-Focus Optical System

Figure 12:
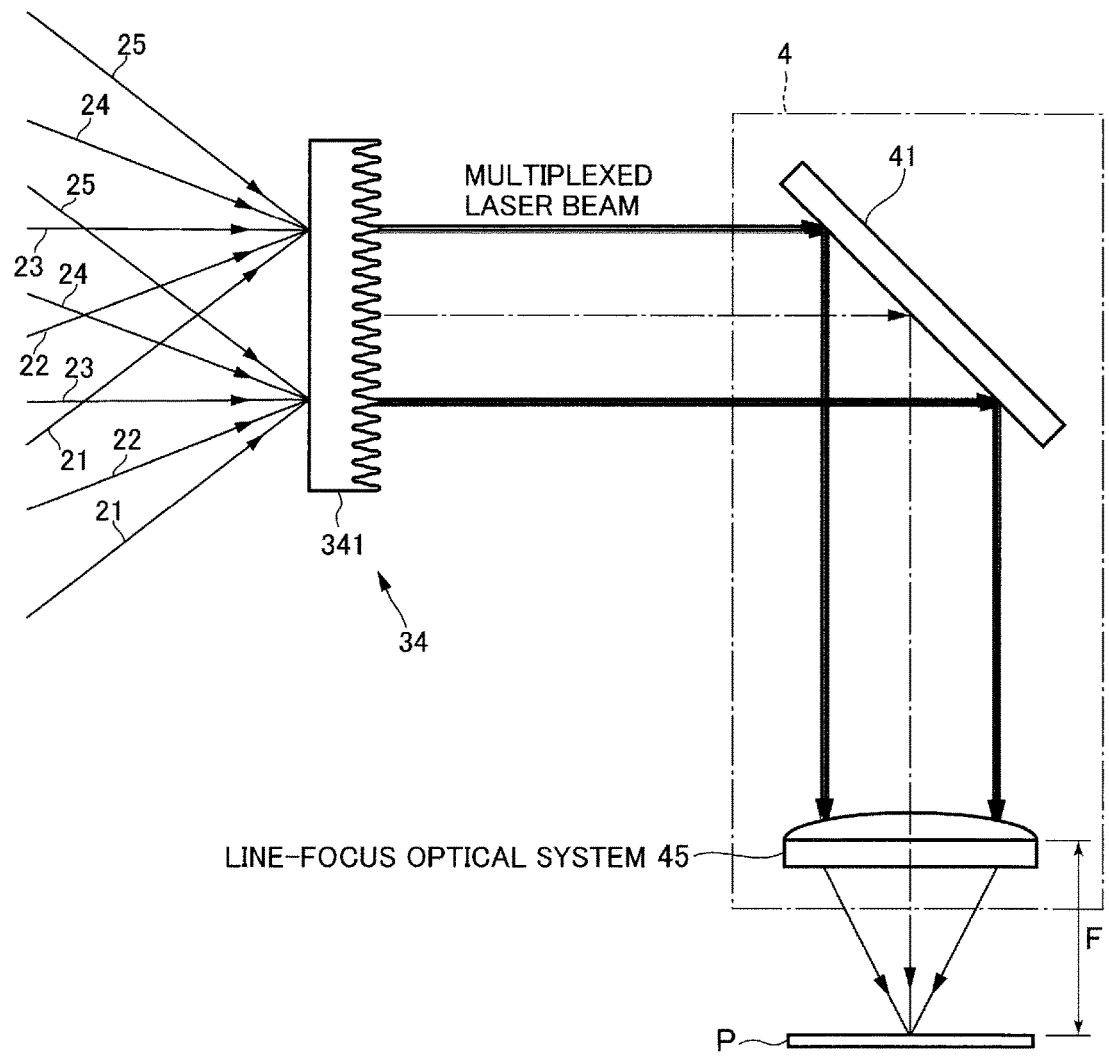
FIG. 12 is a drawing explaining the configuration of the exposure device including a line-focus optical system.
Figure 13:
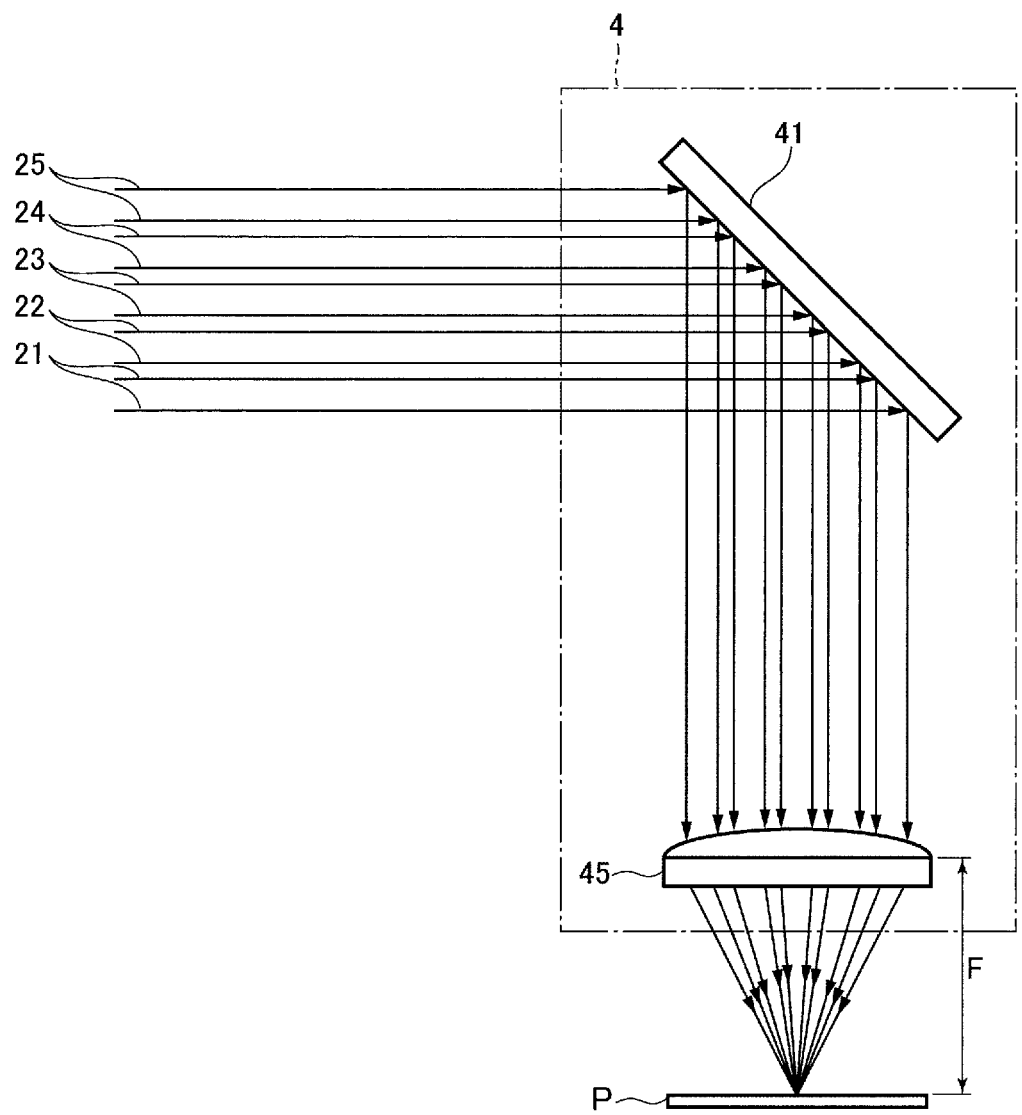
FIG. 13 is a drawing explaining the configuration of the exposure device including a line-focus optical system when a plurality of laser beams converted into parallel beams enter the exposure device.

Now, with reference to FIGS. 12 and 13, the exposure device 4 including a line-focus optical system 45 will be described. FIG. 12 is a drawing explaining the configuration of the exposure device 4 including the line-focus optical system 45. FIG. 13 is a drawing explaining the configuration of the exposure device 4 including the line-focus optical system 45 when the plurality of laser beams converted into parallel beams enter the exposure device 4.

In a case in which the laser beams multiplexed by the beam combiner element 34 including the diffractive optical element 341 enter the exposure device 4, or in which the laser beams converted into parallel beams enter the exposure device 4, the exposure device 4 may have configurations shown in FIGS. 12 and 13. The exposure device 4 shown in FIGS. 12 and 13 may be appropriate for a case in which the irradiated subject P is irradiated with the laser beam having a linear beam cross-section. The exposure device 4 shown in FIGS. 12 and 13 may be provided with the line-focus optical system 45, instead of the transfer optical system 44. The exposure device 4 shown in FIGS. 12 and 13 may not include the illumination optical system 42 and the mask 43.

The line-focus optical system 45 may shape the beam cross-section of the laser beam having entered the exposure device 4 into a line, and focus the laser beam onto the position at which the irradiated subject P is irradiated with the beam. The line-focus optical system 45 may be formed by a cylindrical convex lens. Alternatively, the line-focus optical system 45 may be formed by combining a cylindrical convex lens and a cylindrical concave lens. The line-focus optical system 45 may be disposed between the high-reflection mirror 41 and the irradiated subject P, on the optical path of the laser beam having entered the exposure device 4. The line-focus optical system 45 may be disposed such that the position of the back focal plane of the line-focus optical system 45 may substantially coincide with the irradiated position of the irradiated subject P.

In a case in which a laser beam entering the exposure device 4 is the laser beams multiplexed by the beam combiner element 34 including the diffractive optical element 341, the irradiated subject P may be irradiated with the laser beam as follows. As shown in FIG. 12, the laser beam having entered the exposure device 4 may be reflected from the high-reflection mirror 41, and enter the line-focus optical system 45. The laser beam having entered the line-focus optical system 45 may be linearly focused on the position of the back focal plane of the line-focus optical system 45, and emitted to the irradiated position of the irradiated subject P.

Meanwhile, in a case in which laser beams entering the exposure device 4 are the laser beams converted into parallel beams, the irradiated subject P may be irradiated with those laser beams as follows. As shown in FIG. 13, the laser beams entering the exposure device 4 may be a plurality of laser beams whose optical path axes are parallel to each other. The plurality of laser beams having entered the exposure device 4 may be reflected from the high-reflection mirror 41, and enter the line-focus optical system 45. The plurality of laser beams having entered the line-focus optical system 45 may be linearly focused on the position of the back focal plane of the line-focus optical system 45, and emitted to the irradiated position of the irradiated subject P. At this time, the laser beams focused on the position of the back focal plane of the line-focus optical system 45 may be superposed on the irradiated position of the irradiated subject P by the line-focus optical system 45. That is, the line-focus optical system 45 may shape the plurality of laser beams, which have been outputted from the plurality of laser devices 2, been converted into parallel beams, and entered the line-focus optical system 45, to have linear cross-sections, and superpose the plurality of laser beams on approximately the same optical path at the irradiated position of the irradiated subject P. As a result, when the plurality of laser beams outputted from the plurality of laser devices 2 are emitted to the irradiated position of the irradiated subject P, the line-focus optical system 45 can multiplex the plurality of laser beams.

The laser exposure system 1 including the exposure device 4 shown in FIGS. 12 and 13 can multiplex the plurality of laser beams outputted from the plurality of laser devices 2 and irradiate the irradiated subject P with the multiplexed laser beams without the illumination optical system 42 and the mask 43. Therefore, the laser exposure system 1 including the exposure device 4 shown in FIGS. 12 and 13 can increase the efficiency of energy transfer of the laser beam emitted to the irradiated subject P per pulse, and also allow the light intensity distribution in the beam cross-section to be uniform, while significantly simplifying the optical system of the exposure device 4.

8. Others 8.1 Fly-Eye Lens

Figure 14A:
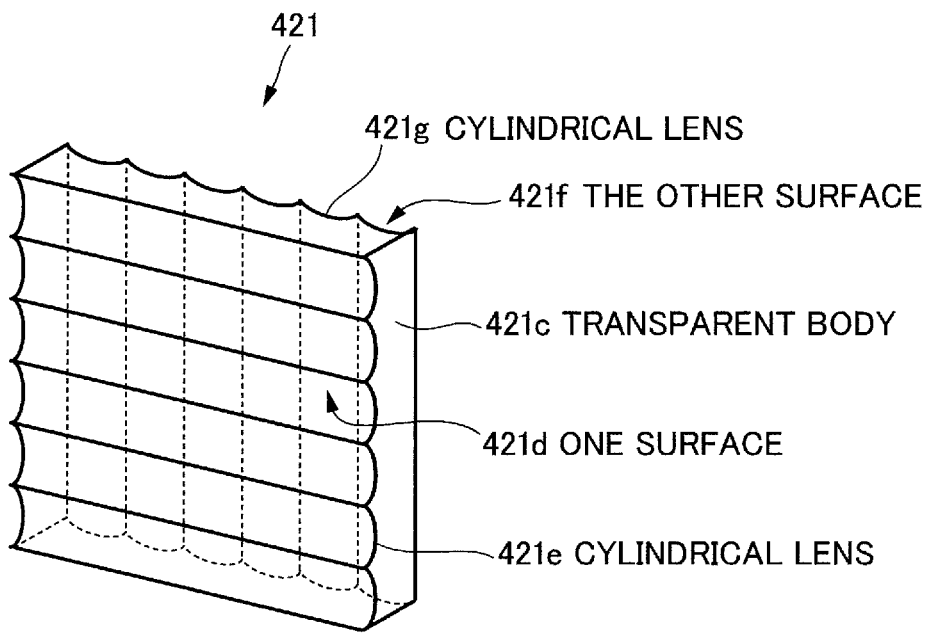
FIG. 14A is a drawing explaining a configuration of a plurality of lenses included in the fly-eye lens shown in FIG. 1.
Figure 14B:
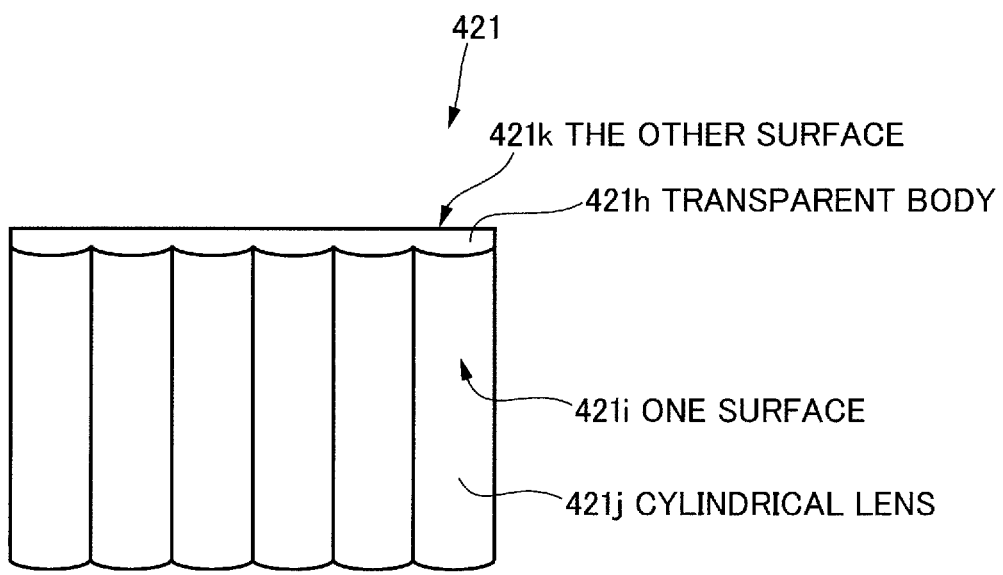
FIG. 14B is a drawing explaining another configuration of a plurality of lenses included in the fly-eye lens shown in FIG. 1.

Now, with reference to FIGS. 14A and 14B, the detailed configuration of a plurality of lenses included in the fly-eye lens 421 shown in FIG. 1 will be described. FIG. 14A is a drawing explaining a configuration of the plurality of lenses included in the fly-eye lens 421 shown in FIG. 1. FIG. 14B is a drawing explaining another configuration of the plurality of lenses included in the fly-eye lens 421 shown in FIG. 1.

The fly-eye lens 421 shown in FIG. 1 may be formed by using a transparent body 421c made of, for example, a synthetic silica or calcium fluoride substrate which allows ultraviolet light to transmit therethrough as shown in FIG. 14A. A number of cylindrical lenses 421e having concave surfaces may be formed on one surface 421d of the transparent body 421c along one direction. Meanwhile, on the other surface 421f of the transparent body 421c, a number of cylindrical lenses 421g having concave surfaces may be formed along the direction perpendicular to the direction in which the cylindrical lenses 421e extend.

In addition, the fly-eye lens 421 shown in FIG. 1 may be formed by using a transparent body 421h made of, for example, a synthetic silica or calcium fluoride substrate which allows ultraviolet light to transmit therethrough as shown in FIG. 14B. A number of cylindrical lenses 421j having convex surfaces may be formed on one surface 421i of the transparent body 421h along one direction. The other surface 421k of the transparent body 421h may be flat. Then, the fly-eye lens 421 may be formed by arranging two transparent bodies 421h in series with each other. In this case, the two transparent bodies 421h may be disposed such that the direction in which the cylindrical lenses 421j of one transparent body 421h extend is perpendicular to the direction in which the cylindrical lenses 421j of the other transparent body 421h extend.

Here, the configurations of the fly-eye lens 421 shown in FIGS. 14A and 14B may be applied to the configuration of the fly-eye lens 342a described above. The configuration of the fly-eye lens 421 shown in FIG. 14B may be applied to the configuration of the above-described first fly-eye lens 421a and second fly-eye lens 421b. In addition, the configuration of the fly-eye lens 421 is not limited to the configurations shown in FIGS. 14A and 14B. Another configuration of the fly-eye lens 421 is possible where, for example, a transparent body which allows ultraviolet light to transmit therethrough is provided with various lens arrays such as a number of Fresnel lenses.

8.2 Holder Including a Refrigerant Flow Path

Figure 15:
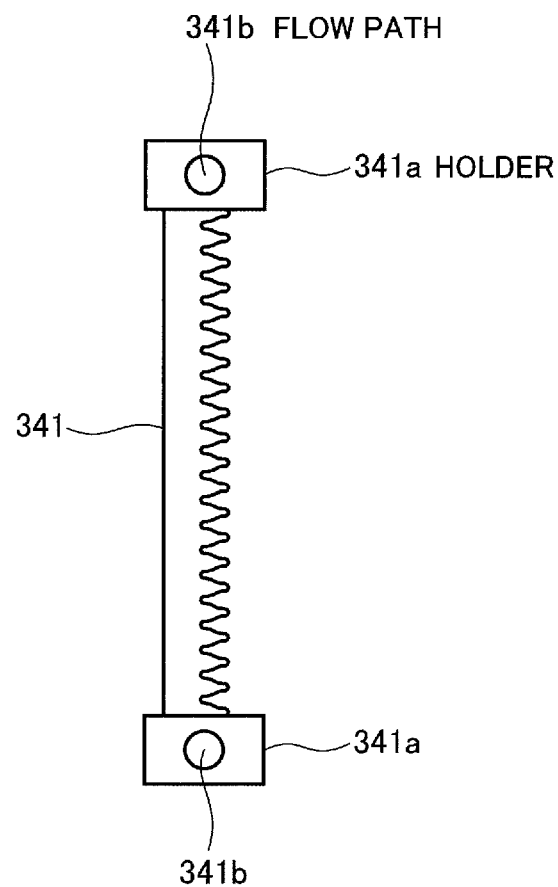
FIG. 15 is a drawing explaining a holder configured to hold the diffractive optical element.

Now, with reference to FIG. 15, a holder 341a configured to hold the diffractive optical element 341 will be described. FIG. 15 is a drawing explaining the holder 341a configured to hold the diffractive optical element 341.

The holder 341a may be formed by using a metallic material or a ceramic material having a high thermal conductivity. A flow path 341b through which a refrigerant flows may be provided in the holder 341a. The refrigerant may be cooling water. The flow path 341b may be provided along the outer periphery of the diffractive optical element 341 held by the holder 341a. The flow path 341b may be connected to a pump (not shown). The refrigerant flowing through the flow path 341b may be circulated by the pump. The diffractive optical element 341 held by the holder 341a may absorb part of the received laser beams, and therefore generate heat. The heat generated in the diffractive optical element 341 may be transferred to the holder 341a. The heat transferred to the holder 341a may be transferred to the refrigerant circulating through the flow path 341b, and discharged to the outside of the holder 341a. By this means, it is possible to efficiently cool the diffractive optical element 341 held by the holder 341a, even though the diffractive optical element 341 absorbs the laser beam and therefore generates heat. Accordingly, it is possible to prevent the diffractive optical element 341 held by the holder 341a from being damaged due to the incident laser beams, and therefore to lengthen the life of the diffractive optical element 341. Here, the configuration of the holder including the refrigerant flow path is not limited to the holder 341a configured to hold the diffractive optical element 341, but may be applicable to a holder configured to hold a different optical element.

8.3 Modification

It would be obvious to a person skilled in the art that the technologies described in the above-described embodiments including the modifications may be compatible with each other. The descriptions above are intended to be illustrative only and the present disclosure is not limited thereto. Therefore, it will be apparent to those skilled in the art that it is possible to make modifications to the embodiments of the present disclosure within the scope of the appended claims.

The terms used in this specification and the appended claims should be interpreted as "non-limiting." For example, the terms "include" or "be included" should be interpreted as "including the stated elements but not limited to the stated elements." The term "have" should be interpreted as "having the stated elements but not limited to the stated elements." Further, the modifier "a/an" in this specification and the appended claims should be interpreted as "at least one" or "one or more.".

REFERENCE SIGNS LIST 1 laser exposure system
2 laser device
3 beam combiner system
32 beam property adjustment unit
321 optical path length adjustment unit
322 beam transfer unit
33 incident optical system
331 secondary light source optical system
332 condenser optical system
333, 335 beam expansion optical system
334 mirror optical system
336 prism optical system
34 beam combiner element
341 diffractive optical element
342 integrator optical system
4 exposure device
5 laser system
P irradiated subject

The invention claimed is:

1. A laser exposure system outputting a laser beam with which a subject is irradiated, comprising:
a first laser device configured to output a first laser beam along a first optical path;
a second laser device configured to output a second laser beam along a second optical path;
a third laser device configured to output a third laser beam along a third optical path;
a first optical element and a second optical element configured to invert an image of the first laser beam;
a third optical element and a fourth optical element configured to invert an image of the third laser beam;
a fifth optical element configured to narrow a distance between the first optical path and the second optical path and a distance between the second optical path and the third optical path;
a sixth optical element configured to guide the inverted first laser beam to a first area of the fifth optical element, guide the second laser beam that has not been inverted to a second area of the fifth optical element and guide the inverted third laser beam to a third area of the fifth optical element, wherein the second area is positioned between the first area and the third area; and
a seventh optical element configured to allow axes of the first optical path, second optical path and third optical path to be the same as each other.

2. The laser exposure system according to claim 1, further comprising
an optical system configured to emit a laser beam multiplexed by the seventh optical element to the subject, wherein
the laser exposure system performs laser annealing of the subject by emitting the laser beam via the optical system to the subject.

3. The laser exposure system according to claim 1, wherein
the seventh optical element includes a beam combiner element.

4. The laser exposure system according to claim 3, wherein the beam combiner element includes a diffractive optical element configured to allow the first, second, and third laser beams to be superposed with each other.

5. The laser exposure system according to claim 3, wherein the beam combiner element includes an integrator optical system including a fly-eye lens and a condenser optical system.

6. The laser exposure system according to claim 1, wherein:
a plurality of laser devices includes the first, second, and third laser devices; and
a beam cross-sectional area $S_c$ of the laser beams outputted from the plurality of laser devices and entering the beam combiner element via the incident optical system satisfies a relationship $S_c \geq n \cdot S_0$,
where n represents the number of the plurality of laser devices, and
$S_0$ represents a beam cross-sectional area of each of the plurality of laser beams at exits of the plurality of laser devices.

7. The laser exposure system according to claim 1, wherein:
the sixth optical element includes a beam expansion optical system configured to expand the plurality of laser beams including the first, second, and third laser beams; and
the fifth optical element includes a mirror optical system.

8. The laser exposure system according to claim 1, wherein:
the sixth optical element includes a beam expansion optical system configured to expand the plurality of laser beams including the first, second, and third laser beams; and
the fifth optical element includes a prism optical system configured to irradiate the beam combiner element with the laser beams expanded by the beam expansion optical system.

9. The laser exposure system according to claim 5, further comprising an incident optical system configured to convert optical path axes of the plurality of laser beams including the first, second, and third laser beams to be parallel to each other, and allow the laser beams to enter the beam combiner element.

10. The laser exposure system according to claim 7, wherein:
the mirror optical system includes a first mirror, a second mirror and a third mirror,
the first mirror guides the first laser beam to the first area,
the second mirror guides the second laser beam to the second area, and
the third mirror guides the third laser beam to the third area.

11. The laser exposure system according to claim 1, wherein:
the sixth optical element includes an expansion optical system, and
the fifth optical system includes a transmission optical element.

12. The laser exposure system according to claim 11, wherein:
the expansion optical system includes a plurality of concave lenses, and
the transmission optical element includes a condenser optical system.

* * * * *